United States Patent [19]
Hidaka et al.

[11] Patent Number: 5,773,865
[45] Date of Patent: Jun. 30, 1998

[54] SEMICONDUCTOR MEMORY AND SEMICONDUCTOR DEVICE HAVING SOI STRUCTURE

[75] Inventors: Hideto Hidaka; Takahiro Tsuruda, both of Hyogo, Japan

[73] Assignee: Mitsubishi Denki Kabushiki Kaisha, Tokyo, Japan

[21] Appl. No.: 832,351

[22] Filed: Apr. 2, 1997

Related U.S. Application Data

[62] Division of Ser. No. 463,795, Jun. 5, 1995, Pat. No. 5,635,744.

[30] Foreign Application Priority Data

Sep. 8, 1994 [JP] Japan .................................... 6-214805
Dec. 19, 1994 [JP] Japan .................................... 6-314987

[51] Int. Cl.$^6$ ............................ H01L 27/01; H01L 27/12; H01L 29/76
[52] U.S. Cl. ........................ 257/349; 257/350; 257/351; 257/394; 257/409; 438/152; 438/154
[58] Field of Search .................................... 257/349, 350, 257/351, 394, 409; 438/152, 154

[56] References Cited

U.S. PATENT DOCUMENTS 4,946,799  8/1990  Blake et al. .
4,965,213  10/1990  Blake .
5,001,528  3/1991  Bahraman .
5,079,605  1/1992  Blake .
5,125,007  6/1992  Yamaguchi et al. .
5,440,161  8/1995  Iwamatsu et al. .
5,463,238  10/1995  Takahashi et al. .
5,592,009  1/1997  Hidaka .................................... 257/351

FOREIGN PATENT DOCUMENTS 63-92041  4/1988  Japan .
1-89537   4/1989  Japan .

*Primary Examiner*—Valencia Martin Wallace
*Attorney, Agent, or Firm*—Lowe, Price, LeBlanc & Becker

[57] ABSTRACT

A semiconductor memory and device comprising a plurality of N-channel and P-channel transistor regions, a first and a second field shield region, and an oxide isolation region. The first field shield region is disposed so as to isolate the N-channel transistor regions from one another, and the second field shield region is provided to isolate the P-channel transistor regions from one another. The oxide isolation region is furnished to isolate the N-channel transistor regions from the P-channel transistor regions. The isolation effected by the field shield regions and the isolation provided by the oxide isolation region combine to suppress latch-up, fix the potential in the body regions of the MOS transistors making up the memory or device, and minimize the layout area of the memory or device.

4 Claims, 22 Drawing Sheets

SEMICONDUCTOR MEMORY AND SEMICONDUCTOR DEVICE HAVING SOI STRUCTURE

This application is a division of application Ser. No. 08/463,795 filed Jun. 5, 1995, U.S. Pat. No. 5,635,744.

BACKGROUND OF THE INVENTION

1. Field of the Invention

The present invention relates to a semiconductor memory and a semiconductor device. More particularly, the invention relates to a dynamic random access memory (DRAM) formed on an SOI (Silicon On Insulator) substrate.

2. Description of the Related Art

Semiconductor memories fall primarily into two categories: volatile memories represented by the RAM (Random Access Memory), and nonvolatile memories exemplified by the ROM (Read Only Memory). The nonvolatile memories are further divided into DRAMs and SRAMs (Static Random Access Memories). The nonvolatile memories include mask ROMs, EPROMs, flash memories, EEPROMs and fuse ROMs.

The DRAM in operation needs to be refreshed constantly because it stores data by keeping the capacitor of each of its memory cells electrically charged. On the other hand, the DRAM is suitable for use as a low-cost large-capacity memory device because the memory cell structure thereof is simple to fabricate.

Because DRAMs store data by keeping the capacitor of each of their memory cells charged, they have the disadvantage of being liable to what is known as soft error. The phenomenon of soft error involves alpha particles being released from the package and/or the wiring and entering the substrate to cause carriers therein. When the carriers thus generated reach any capacitor, they alter the amount of charges in that capacitor, whereby the data of the capacitor is inverted.

Meanwhile, recent years have seen progress in the development of semiconductor devices having the so-called SOI (Silicon On Insulator) structure. This structure comprises transistors and like circuit elements formed on the SOI substrate. When thus structured, the semiconductor device includes an insulating layer in its semiconductor substrate and has a very thin SOI active layer formed over the substrate surface of that insulating layer.

One prominent characteristic of the semiconductor device having the SOI structure is the presence of the very thin active layer. Given that characteristic, it is possible to resolve the problem of soft error with DRAMs to which the SOI structure is applied. It is from that standpoint that attempts to fabricate DRAMs having the SOI structure have been contemplated.

When a DRAM is formed conventionally by use of the SOI structure, the transistors constituting that DRAM are each arranged as described below. FIG. 23 is a cross-sectional view showing a typical constitution of an MOS transistor in a conventional SOI-structure semiconductor device.

Referring to FIG. 23, the MOS transistor comprises a first conductivity type pair of source and drain regions 91, a second conductivity type body region 92, and a second conductivity type gate electrode 93.

This MOS transistor is formed on an SOI substrate 90. The SOI substrate is composed of a silicon substrate 94, an insulating layer 95 and an SOI active layer 96. Inside the SOI active layer 96, a pair of a source and a drain region 91 are formed a predetermined distance apart. Between the two regions is the body region 92.

That is, the body region 92 comes under the gate electrode 93. When the gate electrode 93 is fed with a potential of a predetermined level, a channel is formed within the body region 92.

Numerous units of this type of MOS transistor are used throughout the DRAM. Illustratively, in the peripheral circuits of the DRAM, MOS transistors of different conductivity types are combined to constitute a CMOS circuit and the like.

Where the DRAM is formed by use of the SOI structure, one of two methods may be adopted conventionally to isolate the memory elements such as MOS transistors from one another. One method is an LOCOS (LOCal Oxidation of Silicon) isolation method that utilizes an oxide isolation arrangement; the other method is a field shield isolation method that employs field shield gate electrodes. However, these conventional methods have their share of disadvantages as outlined below.

One advantage of adopting the LOCOS isolation method is its ability to protect the CMOS circuit from a latch-up. But this advantage of the LOCOS isolation method is more than offset by its disadvantage involving the body region 92, located under the gate electrode 93 of each transistor, getting into an electrically floating state. This floating state is caused by the fact that the body region 92 is electrically isolated from the silicon substrate 94 by the insulating layer 95.

With the body region 92 in the floating state, the following troubles arise: the withstanding voltage between the source and the drain is undermined by parasitic bipolar action. There occurs an increased tendency for a leak current to flow between the source and the drain. Furthermore, a kink is generated and the drain current Id—drain voltage Vd characteristic is observed. That is, the operation of the transistors becomes unstable.

One advantage of utilizing the field shield isolation method is that the body region 92 of each transistor has its potential fixed so that the above-mentioned troubles associated with the floating state do not occur. This benefit stems from the fact that all regions in the SOI active layer 96 are in PN junction. However, the field shield isolation method has one distinct disadvantage: a latch-up can occur inside the CMOS circuit.

SUMMARY OF THE INVENTION

It is therefore an object of the present invention to provide a semiconductor memory and a semiconductor device capable of preventing the latch-up phenomenon and of fixing the potential of the body regions in the MOS transistors constituting the memory or device.

It is another object of the invention to provide a semiconductor memory and a semiconductor device having a minimum of layout areas.

In carrying out the invention and according to a first aspect thereof, there is provided a semiconductor memory formed on an SOI substrate. This semiconductor memory comprises a plurality of N-channel transistor regions, a plurality of P-channel transistor regions, a first field shield region, a second field shield region, and an oxide isolation region.

Each of the N-channel transistor regions has an N-channel MOS transistor formed therein. Each of the P-channel transistor regions has a P-channel MOS transistor formed therein.

The first field shield region isolates the N-channel transistor regions from one another. The second field shield region isolates the P-channel transistor regions from one another.

The oxide isolation region is formed between the N-channel transistor regions on one hand, and the P-channel transistor regions on the other hand. The two types of the transistor regions are disposed adjacent to each other. This oxide isolation region isolates the two types of the transistor regions from each other.

With the structure according to the first aspect of the invention, the N-channel transistor regions are isolated from one another by the first field shield region, and the P-channel transistor regions are isolated from one another by the second field shield region. Two different field shield regions are provided because the potential fed the field shield region of the N-channel MOS transistors is different from the potential supplied to the field shield region of the P-channel MOS transistors.

These field shield regions are arranged to fix the potential in each of the body regions under the gate electrodes of the N- and P-channel transistor regions.

Furthermore, the N-channel transistor regions are isolated from the P-channel transistor regions by the oxide isolation region. The presence of the oxide isolation region for isolation between the two types of transistor regions prevents the occurrence of latch-up. With the possibility of latch-up eliminated, the N- and P-channel transistor regions may be located the shortest possible distance apart. This minimizes the layout area involved.

In a preferred structure according to the invention, the semiconductor memory comprises an isolation region where the first and the second field shield region overlap with the oxide isolation region.

With this preferred structure, a boundary is formed between the first field shield region and the oxide isolation region, and another boundary is formed between the second field shield region and the oxide isolation region. It is on these boundaries that the shielding effect of the field shield works near the bird's beaks in the active layer of the SOI substrate.

This makes it possible to suppress any leak currents that can occur close to the bird's beaks on the boundaries of the oxide isolation region with the first and the second field shield region.

In another preferred structure according to the invention, the first and the second field shield region include a field shield gate electrode each. The oxide isolation region includes an oxide isolation film constituting a part thereof. The field shield gate electrodes of the first and the second field shield region extend partially over the oxide isolation film.

With this preferred structure, a boundary is also formed between the first field shield region and the oxide isolation region, as well as between the second field shield region and the oxide isolation region. It is on these boundaries that the shielding effect of the field shield gate electrodes works near the bird's beaks in the active layer of the SOI substrate.

This setup also suppresses any leak currents that can occur close to the bird's beaks on the boundaries of the oxide isolation region with the first and the second field shield region.

In a further preferred structure according to the invention, the first and the second field shield region include a field shield gate electrode each. The oxide isolation region includes an oxide isolation film constituting a part thereof. The oxide isolation film extends partially under the field shield gate electrodes.

With this preferred structure, there also occurs a boundary between the first field shield region and the oxide isolation region, and another boundary between the second field shield region and the oxide isolation region. On these boundaries, the shielding effect of the field shield gate electrodes works close to the bird's beaks in the active layer of the SOI substrate.

This also makes it possible to suppress any leak currents that can occur near the bird's beaks on the boundaries of the oxide isolation region with the first and the second field shield region.

According to a second aspect of the invention, there is provided a semiconductor device formed on an SOI substrate having an SOI active layer over an oxide film. This semiconductor device comprises a plurality of N-channel transistor regions, a plurality of P-channel transistor regions, a first field shield region, a second field shield region, and a third impurity region.

Each of the N-channel transistor regions has an N-channel transistor formed therein. Each of the P-channel transistor regions has a P-channel transistor formed therein.

The N-channel transistor regions and the P-channel transistor regions each comprise a pair of a source and a drain region formed a predetermined distance apart in the SOI active layer, and a body region formed between the source and the drain region in the SOI active layer.

The first field shield region is composed of a first impurity region formed in the SOI active layer and of a first field shield gate electrode formed over the first impurity region. The first field shield region isolates the N-channel transistor regions from one another.

The second field shield region is composed of a second impurity region formed in the SOI active layer and of a second field shield gate electrode formed over the second impurity region. The second field shield region isolates the P-channel transistor regions from one another.

The third impurity region is formed in the SOI active layer between the first and the second impurity region. The third impurity region is supplied with a predetermined potential. The potential supplied to the third impurity region is given, via at least one of the first and the second impurity region, to the body regions of the transistor regions of at least one of the two conductivity types, one conductivity type being that of the N-channel transistor regions, the other conductivity type being that of the P-channel transistor regions.

With the structure according to the second aspect of the invention, the N-channel transistor regions are isolated from one another by the first field shield region, and the P-channel transistor regions are isolated from one another by the second field shield region.

The third impurity region is formed in the SOI active layer between the first impurity region included in the first field shield region on one hand, and the second impurity region included in the second field shield region on the other hand. The third impurity region is a region that receives the predetermined potential for fixing the potential in the body regions of the relevant transistor regions.

The potential supplied to the third impurity region is given, via at least one of the first and the second impurity region, to the body regions of the transistor regions of at least one of the two conductivity types (N-or P-channel transistor regions). This fixes the potential in the body regions of the transistor regions of at least one conductivity type.

As described, between the first and the second field shield region of the above structure is the third impurity region that receives the potential for fixing the potential in the body regions. This arrangement serves specifically to fix the potential in the body regions of the transistor regions.

The presence of the impurity region between the first and the second field shield region makes it possible effectively to fix the potential in the body regions of the transistor regions. This means that the boundary portion between the N-channel transistor regions and the P-channel transistor regions is structurally simplified.

This SOI structure has no wells. The structure thus allows the N-channel transistor regions and the P-channel transistor regions to be located the shortest possible distance apart. This contributes to minimizing the layout area involved.

According to a third aspect of the invention, there is provided a semiconductor device formed on an SOI substrate having an SOI active layer over an oxide film. This semiconductor device comprises a plurality of N-channel transistor regions, a plurality of P-channel transistor regions, a first field shield region, a second field shield region, a third impurity region, a fourth impurity region, and a third field shield region.

Each of the N-channel transistor regions has an N-channel transistor formed therein. Each of the P-channel transistor regions has a P-channel transistor formed therein.

The N-channel transistor regions and the P-channel transistor regions each comprise a pair of a source and a drain region formed a predetermined distance apart in the SOI active layer, and a body region formed between the source and the drain region in the SOI active layer.

The first field shield region is composed of a first impurity region formed in the SOI active layer and of a first field shield gate electrode formed over the first impurity region. The first field shield region isolates the N-channel transistor regions from one another.

The second field shield region is composed of a second impurity region formed in the SOI active layer and of a second field shield gate electrode formed over the second impurity region. The second field shield region isolates the P-channel transistor regions from one another.

The third and the fourth impurity region are formed a predetermined distance apart in the SOI active layer between the first and the second impurity region. One of the third and the fourth impurity region is in contact with the first impurity region, the other impurity region in contact with the second impurity region. The third and the fourth impurity region have a different conductivity type each.

The third field shield region is composed of a fifth impurity region formed in the SOI active layer between the third and the fourth impurity region and of a third field shield gate electrode formed over the fifth impurity region. The third field shield region isolates the third impurity region from the fourth impurity region.

With the structure according to the third aspect of the invention, the N-channel transistor regions are isolated from one another by the first field shield region, and the P-channel transistor regions are isolated from one,another by the second field shield region.

The third and the fourth impurity region are formed in the SOI active layer between the first impurity region included in the first field shield region on one hand, and the second impurity region included in the second field shield region on the other hand. The third impurity region is isolated from the fourth impurity region by the third field shield region interposed therebetween. The third and the fourth impurity region have a different conductivity type each.

The presence of the third field shield region prevents the third and the fourth impurity region from coming into direct contact with each other. This means that leak currents are suppressed where different potentials are fed to the third and the fourth impurity region so as to fix the potential in the body regions of at least one of the two conductivity types of transistor regions, i.e., the N- or the P-channel transistor regions.

Between the first and the second field shield region are the third field shield region and the third and the fourth impurity region. This allows the potential in the body regions of the relevant transistor regions to be fixed. The arrangement thus simplifies structurally the boundary portion between the N-channel transistor regions and the P-channel transistor regions.

This SOI structure includes no wells. The structure thus allows the N-channel transistor regions and the P-channel transistor regions to be located the shortest possible distance apart. This contributes to minimizing the layout area involved.

In a preferred structure according to the invention, the third and the fourth impurity region are supplied with different potentials. At least one of the two different potentials is given, via at least one of the first and the second impurity region, to the body regions of the transistor regions of at least one of the two conductivity types, one conductivity type being that of the N-channel transistor regions,.the other conductivity type being that of the P-channel transistor regions.

With this preferred structure, two different potentials are supplied to the third and the fourth impurity region of different conductivity types so as to fix the potential in the body regions of the relevant transistor regions. At least one of these different potentials is given, via at least one of the first and the second impurity region, to the body regions of the transistor regions of at least one conductivity type (N or P-channel transistor regions).

The structure above is characterized by the arrangement of having the third and the fourth impurity region fed with two different potentials for fixing the potential in the body regions. This arrangement serves specifically to fix the potential in the body regions of the relevant transistor regions.

According to a fourth aspect of the invention, there is provided a semiconductor device formed on an SOI substrate having an SOI active layer over an oxide film. This semiconductor device comprises a plurality of N-channel transistor regions, a plurality of P-channel transistor regions, a first field shield region, a second field shield region, and a third impurity region.

Each of the N-channel transistor regions has an N-channel transistor formed therein. Each of the P-channel transistor regions has a P-channel transistor formed therein.

The N-channel transistor regions and the P-channel transistor regions each comprise a pair of a source and a drain region formed a predetermined distance apart in the SOI active layer, and a body region formed between the source and the drain region in the SOI active layer.

The first field shield region is composed of a first impurity region formed in the SOI active layer and of a first field shield gate electrode formed over the first impurity region. The first field shield region isolates the N-channel transistor regions from one another.

The second field shield region is composed of a second impurity region formed in the SOI active layer and of a second field shield gate electrode formed over the second impurity region. The second field shield region isolates the P-channel transistor regions from one another.

The third impurity region is formed in the SOI active layer between the first and the second impurity region. The third impurity region is a region of one conductivity type.

With the structure according to the fourth aspect of the invention, the N-channel transistor regions are isolated from one another by the first field shield region, and the P-channel transistor regions are isolated from one another by the second field shield region.

The third impurity region of one conductivity type is formed in the SOI layer between the first impurity region included in the first field shield region on one hand, and the second impurity region included in the second field shield region on the other hand.

With this structure, adding an appropriate potential to the third impurity region of one conductivity type makes it possible to fix the potential in the body regions of the relevant transistor regions. Because the presence of the third impurity region of one conductivity type between the first and the second field shield region serves to fix the potential in the body regions of the transistor regions, it is possible structurally to simplify the boundary portion between the N-channel transistor regions and the P-channel transistor regions.

Because this SOI structure has no wells, the N-channel transistor regions and the P-channel transistor regions are allowed to be located the shortest possible distance apart. This contributes to minimizing the layout area involved.

In a preferred structure according to the invention, the third impurity region is supplied with one kind of potential. The predetermined potential fed to the third impurity region is given, via one of the first and the second impurity region, to the body regions of the transistor regions of at least one of the two conductivity types, one conductivity type being that of the N-channel transistor regions, the other conductivity type being that of the P-channel transistor regions.

With this preferred structure, the third impurity region of one conductivity type is supplied with one kind of potential in order to fix the potential in the body regions of the relevant transistor regions. The potential thus supplied is given, via one of the first and the second impurity region, to the body regions of the transistor regions of at least one of the two conductivity types (N- or P-channel transistor regions).

The structure above is characterized by the arrangement of having the third impurity region of one conductivity type supplied with one kind of potential for fixing the potential in the body regions. This arrangement serves specifically to fix the potential in the body regions of the relevant transistor regions.

According to a fifth aspect of the invention, there is provided a semiconductor device formed on an SOI substrate having an SOI active layer over an oxide film. This semiconductor device comprises a plurality of N-channel transistor regions, a plurality of P-channel transistor regions, a first field shield region, a second field shield region, a third impurity region, and a fourth impurity region.

Each of the N-channel transistor regions has an N-channel transistor formed therein. Each of the P-channel transistor regions has a P-channel transistor formed therein.

The N-channel transistor regions and the P-channel transistor regions each comprise a pair of a source and a drain region formed a predetermined distance apart in the SOI active layer, and a body region formed between the source and the drain region in the SOI active layer.

The first field shield region is composed of a first impurity region formed in the SOI active layer and of a first field shield gate electrode formed over the first impurity region. The first field shield region isolates the N-channel transistor regions from one another.

The second field shield region is composed of a second impurity region formed in the SOI active layer and of a second field shield gate electrode formed over the second impurity region. The second field shield region isolates the P-channel transistor regions from one another.

The third impurity region is formed in the SOI active layer between the first and the second impurity region. The third impurity region is supplied with a first potential. The fourth impurity region is different in conductivity type from the third impurity region and is formed in the SOI active region so that one of the first and the second field shield region is disposed between the third and the fourth impurity region. The fourth impurity region is supplied with a second potential.

The second potential supplied to the fourth impurity region is given, via the impurity region of one of the first and the second field shield region disposed between the third and the fourth impurity region, to the body regions of those transistor regions of one conductivity type which are isolated from one another by that one field shield region. The first potential supplied to the third impurity region is given, via the impurity region of the other one of the first and the second field shield region, to the body regions of the transistor regions of the other conductivity type.

With the structure according to the fifth aspect of the invention, the N-channel transistor regions are isolated from one another by the first field shield region, and the P-channel transistor regions are isolated from one another by the second field shield region.

The third impurity region is formed in the SOI layer between the first impurity region included in the first field shield region on one hand, and the second impurity region included in the second field shield region on the other hand. The third impurity region is a region that receives the first potential for fixing the potential in the body regions of the transistor regions of one conductivity type.

The fourth impurity region is formed in the SOI active layer in such a manner that one of the first and the second field shield region is interposed between the third and the fourth impurity region. The fourth impurity region is a region that receives the second potential for fixing the potential in the body regions of the transistor regions of the other conductivity type.

The second potential is given, via one field shield region disposed between the third and the fourth impurity region, to the body regions of those transistor regions of one conductivity type which are isolated from one another by that one field shield region. This fixes the potential in the body regions of the transistor regions of one conductivity type.

The first potential is given, via the other field shield region between the third and the fourth impurity region, to the body regions of those transistor regions of the other conductivity type which are isolated from one another by that other field shield region. This fixes the potential in the body regions of the transistor regions of the other conductivity type. with this structure, as described, the third impurity region that receives the first potential for fixing the potential in the body regions of the transistor regions of one conductivity type is interposed between the first and the second field shield region. The fourth impurity region that receives the second potential for fixing the potential in the body regions of the transistor regions of the other conductivity type is disposed so that one of the first and the second field shield region is located between the third and the fourth impurity region. This setup serves specifically to fix the potential in the body regions of the transistor regions of both conductivity types.

Furthermore, as described, one impurity region is disposed between the first and the second field shield region, and another impurity region is provided in such a way that one of the first and the second field shield region is located between these two impurity regions. This constitution effectively fixes the potential in the body regions of the transistor regions. This means that the boundary portion between the N-channel transistor regions and the P-channel transistor regions is structurally simplified.

This SOI structure has no wells. The structure thus allows the N-channel transistor regions and the P-channel transistor regions to be located the shortest possible distance apart. This contributes to minimizing the layout area involved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the invention will now be described with reference to the accompanying drawings.

First Embodiment

Figure 1:
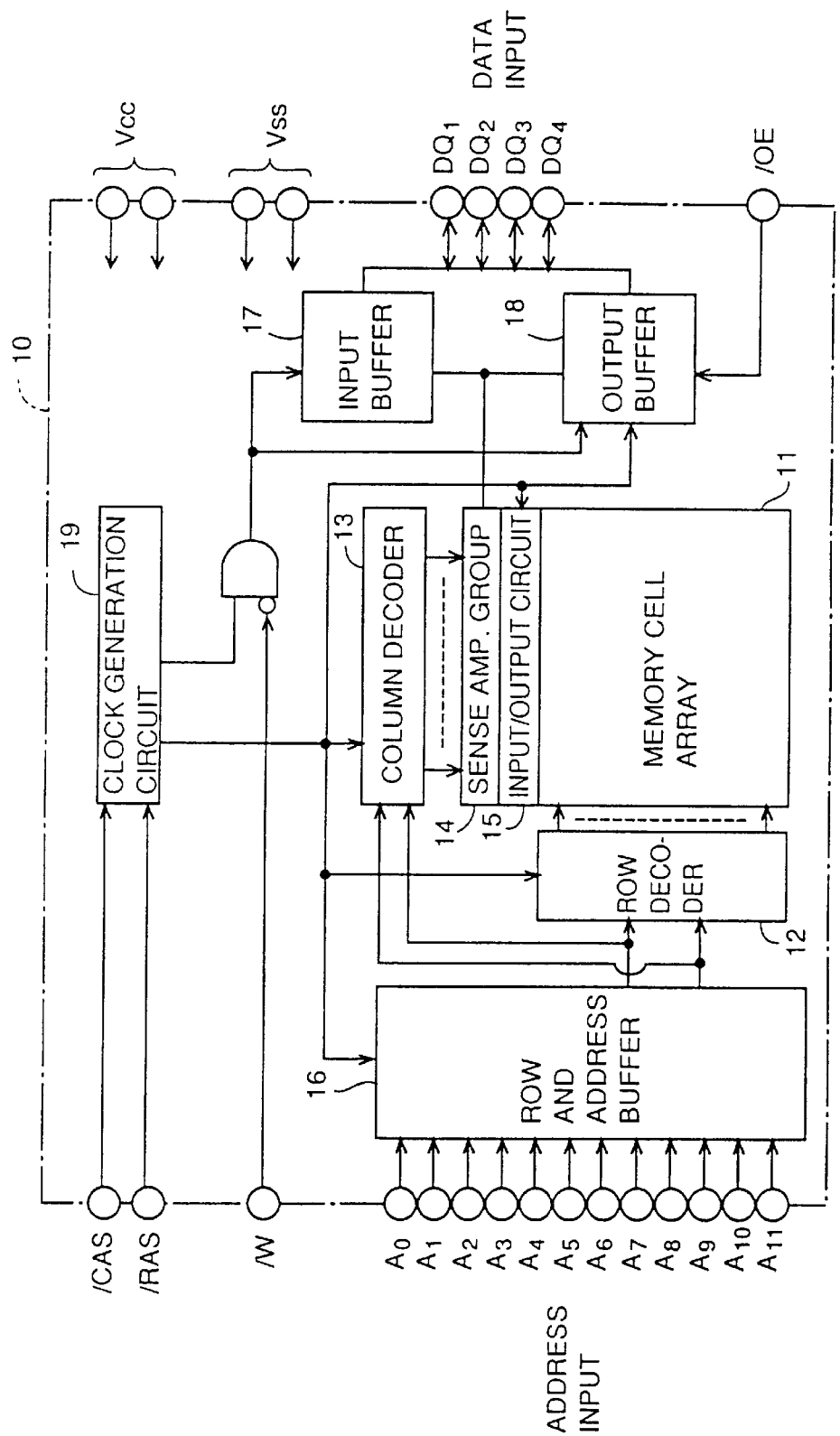
FIG. 1 is a block diagram showing the overall constitution of a SOI-structure DRAM practiced as a first embodiment of he invention.

FIG. 1 is a block diagram showing the overall constitution of an SOI-structure DRAM 10 practiced as the first embodiment of the invention.

Referring to FIG. 1, the DRAM 10 comprises a memory cell array 11, a row decoder 12, a column decoder 13, a sense amplifier group 14, an input/output circuit 15, a row and column address buffer 16, an input buffer 17, an output buffer 18 and a clock generation circuit 19.

The memory cell array 11 includes a plurality of word lines, a plurality of bit line pairs that intersect the word lines perpendicularly, and memory cells located at the points of intersection between the word lines and the bit line pairs. The memory cells serve to accumulate data.

The clock generation circuit 11 receives a column address strobe signal/CAS and a row address strobe signal/RAS, and generates a clock signal in return. The clock signal is supplied to the row decoder 12, the column decoder 13, the row and column address buffer 16, the input buffer 17 and the output buffer 18. These component parts operate in response to the clock signal thus supplied.

The row and column address buffer 16 receives an external address signal, and in turn sends an internal address signal to the row decoder 12 and column decoder 13. The row decoder 12 includes a plurality of MOS transistors. In operation, the row decoder 12 drives selectively any one of the word lines. The column decoder 13 also includes a plurality of MOS transistors. This column decoder 13 selects any one of the bit line pairs.

The sense amplifier group 14 is composed of a plurality of sense amplifiers. Each sense amplifier includes a plurality of MOS transistors. In operation, each sense amplifier senses and amplifies the potential difference of a bit line pair.

Through the output buffer 18, the input/output circuit 15 sends to the outside a signal having a level corresponding to the potential difference of the bit line pair selected by the row decoder 13. At the same time, the input/output circuit 15 supplies the bit line pair selected by the column decoder 13 with the potential difference corresponding to the data that is input via the input buffer 17 from the outside.

The DRAM 10 of FIG. 1 is formed on an SOI substrate. Of the circuits constituting the DRAM 10, those other than the memory cell array 11 are called peripheral circuits. Most of these peripheral circuits comprise both N-channel MOS transistors (called NMOS transistors hereunder) and P-channel MOS transistors (PMOS transistors hereunder).

In other words, each of the most peripheral circuits includes N-channel transistor regions having NMOS transistors formed therein and P-channel transistor regions having PMOS transistors formed therein.

Of the peripheral circuits, the row decoder 12, column decoder 13 and sense amplifier group 14 each have the N-channel transistor regions and the P-channel transistors disposed a short distance apart therein.

In the description that follows, the region where a plurality of P-channel transistor regions are formed is called a P-channel transistor formation region, and the region where a plurality of N-channel transistor regions are formed is called an N-channel transistor formation region.

Each N-channel transistor region is defined as a region in which a single N-channel MOS transistor is formed. Each P-channel transistor region is defined as a region where a single P-channel MOS transistor is formed.

Described below is the constitution of such peripheral circuits as the row decoder 12, column decoder 13 and sense amplifier group 14 in which the NMOS transistors are located adjacent to the PMOS transistors.

Figure 2:
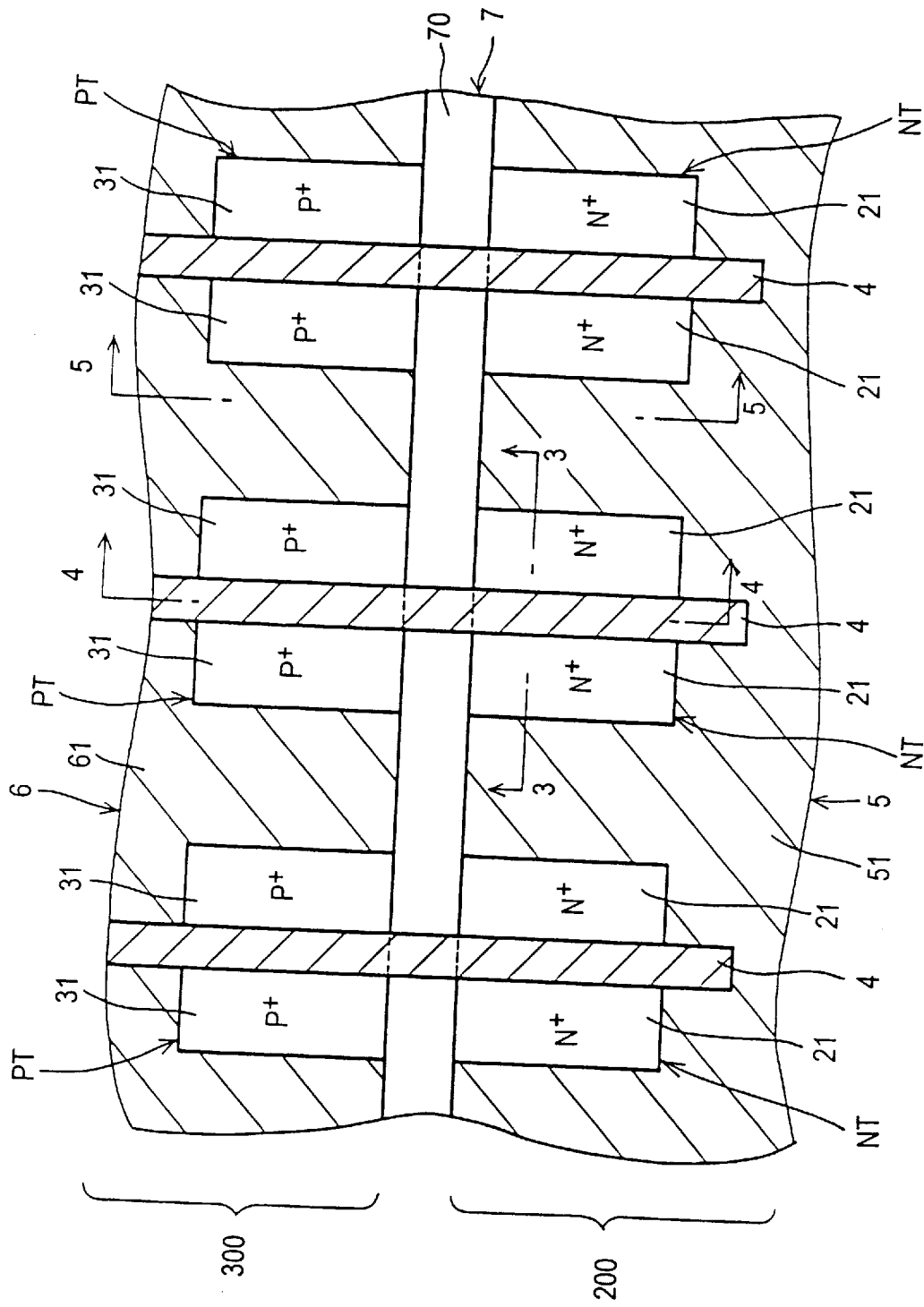
FIG. 2 is a plan view of part of peripheral circuits in the first embodiment.

FIG. 2 is a plan view of part of the peripheral circuits in the DRAM practiced as the first embodiment.

Referring to FIG. 2, the N-channel transistor formation region 200 has a plurality of N-channel transistor regions NT, NT, etc. disposed a predetermined distance apart therein. These N-channel transistor regions NT, NT, etc. are isolated from one other by a first field shield region 5. Each N-channel transistor region NT has an N+ type pair of a source and a drain region 21.

The P-channel transistor formation region 300 has a plurality of P-channel transistor regions PT, PT, etc. disposed a predetermined distance apart therein. These P-channel transistor regions PT, PT, etc. are isolated from one other by a second field shield region 6. Each P-channel transistor region PT has a P+ type pair of a source and a drain region 31.

The first field shield region 5 includes a field shield gate electrode 51 covering that region 5. The second field shield region 6 includes a field shield gate electrode 61 covering that region 6.

In FIG. 2, the field shield gate electrode 51 is shown to delimit the first field shield region 5; the field shield gate electrode 61 is shown to delimit the second field shield region 6.

An oxide isolation region 7 is interposed between the N-channel transistor formation region 200 and the P-channel transistor formation region 300. The oxide isolation region 7 is composed of an oxide isolation film 70. The oxide isolation region 7 extends along the boundary between the N-channel transistor formation region 200 and the P-channel transistor formation region 300.

In the N-channel transistor formation region 200 and the P-channel transistor formation region 300 exist a plurality of gate electrodes 4, 4, etc. in the direction perpendicular to that in which the oxide isolation film 70 extends. The gate electrodes 4, 4, etc. each pass through the oxide isolation film 70 and extend into the N-channel transistor formation region 200 and P-channel transistor formation region 300.

In the N-channel transistor formation region 200, each gate electrode 4 is formed on the body region between a pair of a source and a drain region 21. In the P-channel transistor formation region 300, each gate electrode 4 is formed on the body region between a pair of a source and a drain region 31.

In the N-channel transistor formation region 200, one pair of a source and a drain region 21, a gate electrode 4 and a body region constitute a single NMOS transistor. In the P-channel transistor formation region 300, one pair of a source and a drain region 31, a gate electrode 4 and a body region constitute a single PMOS transistor. One NMOS transistor and one PMOS transistor make up a CMOS circuit sharing a single gate electrode 4.

A number of cross sections whose locations are indicated in FIG. 2 will now be described in terms of their structure.

Figure 3:
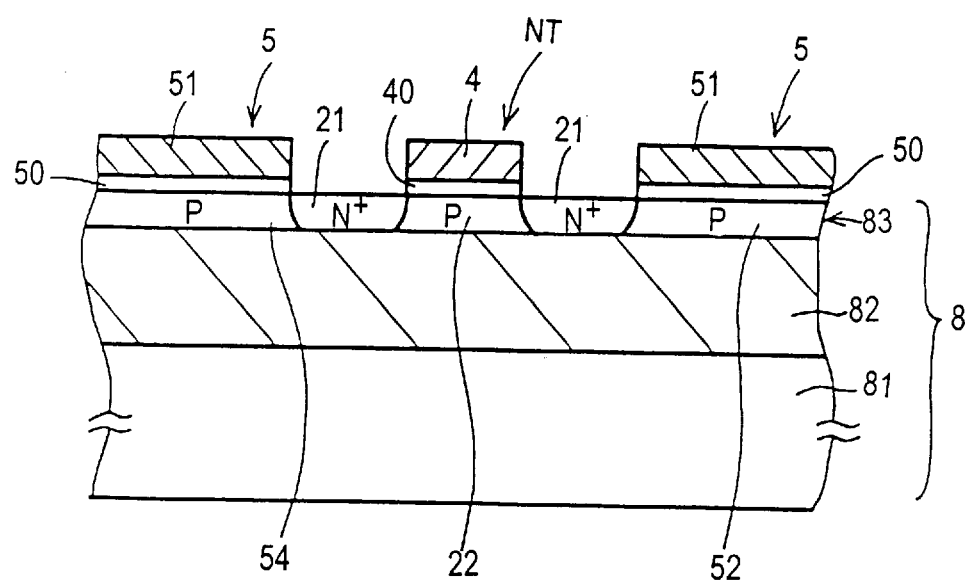
FIG. 3 is a cross-sectional view taken on line A—A in FIG. 2.

FIG. 3 is a cross-sectional view taken on line A—A in FIG. 2. The cross-sectional view of FIG. 3 depicts a portion where an N-channel transistor region NT is isolated by the first field shield region 5.

Referring to FIG. 3, an insulating layer 82 is formed on a silicon substrate 81. The insulation layer 82 has a thin SOI active layer 83 disposed thereon. The silicon substrate 81, the insulating layer 82 and the SOI active layer 83 constitute an SOI substrate 8.

In the N-channel transistor region NT, the SOI active layer 83 contains a pair of a source and a drain region 21 surrounding a P-type body region 22. On top of the body region 22 is a gate electrode 4 formed with a gate oxide film 40 interposed therebetween.

In the first field shield region 5, the SOI active layer 83 contains a P-type region 54. The region 54 is connected to each pair of the source and the drain region 21 so as to surround the latter. On top of the region 54 is the field shield gate electrode 51 formed with a gate oxide film 50 disposed therebetween.

The cross-sectional structure of the P-channel transistor region PT and of the second field shield region 6 is the same as that of FIG. 3 except that the polarities of the relevant regions in the SOI active layer 83 are the inverse of those in FIG. 3.

Figure 4:
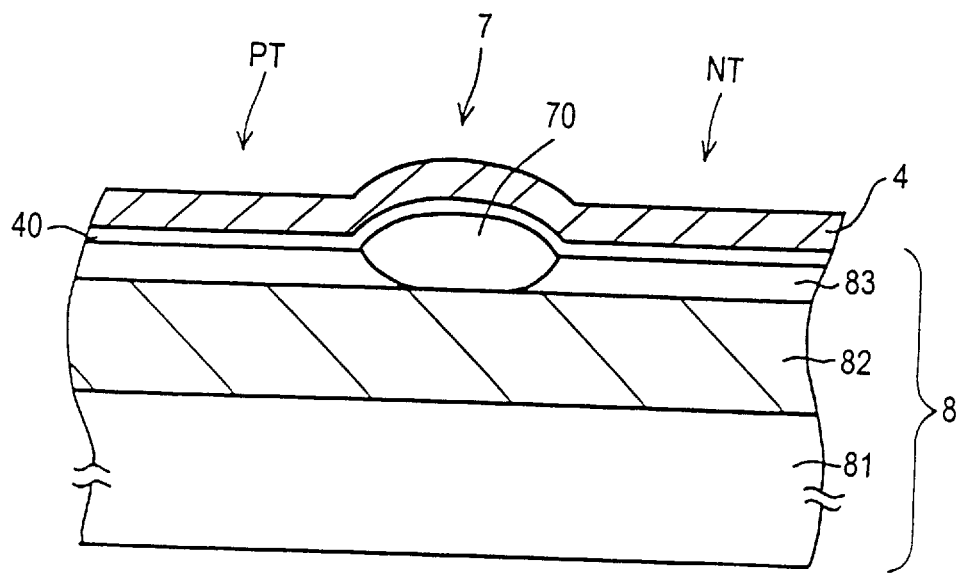
FIG. 4 is a cross-sectional view taken on line B—B in FIG. 2.

FIG. 4 is a cross-sectional view taken on line B—B in FIG. 2.

The cross-sectional view of FIG. 4 depicts a portion where an N-channel transistor region NT and a P-channel transistor region PT are isolated from each other by the oxide isolation region 7. Of the component parts in FIG. 4, those commonly shown in FIG. 3 are designated by like reference numerals and their descriptions are omitted where redundant.

Referring to FIG. 4, the oxide isolation film 70 is formed inside the SOI active layer 83. The upper part of the oxide isolation film 70 projects above the SOI active layer 83. On top of the SOI active layer 83 and oxide isolation film 70 are the gate electrode 4 formed with the gate oxide film 40 interposed therebetween. The gate electrode 4 passes through the oxide isolation film 70 and extends into the N-channel transistor region NT and P-channel transistor region PT.

Figure 5:
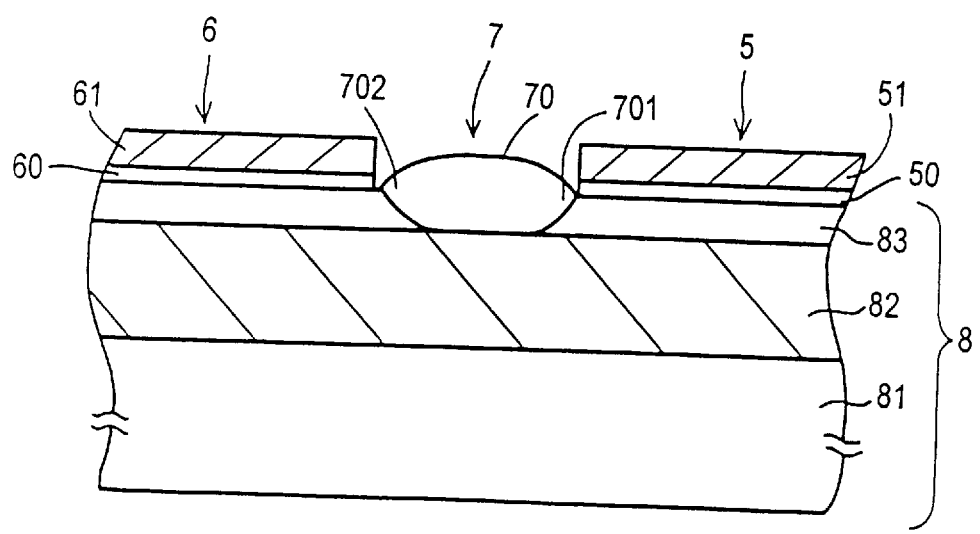
FIG. 5 is a cross-sectional view taken on line C—C in FIG. 2.

FIG. 5 is a cross-sectional view taken on line C—C in FIG. 2.

The cross-sectional view of FIG. 5 illustrates the boundary between the first and the second field shield region 5 and 6 on one hand, and the oxide isolation region 7 on the other hand. Of the component parts in FIG. 5, those commonly shown in FIGS. 3 and 4 are designated by like reference numerals and their descriptions are omitted where redundant.

Referring to FIG. 5, the first field shield region 5 has the field shield gate electrode 51 formed therein with the gate oxide film 50 disposed over the SOI active layer 83. The second field shield region 6 has the field shield gate electrode 61 formed therein with the gate oxide film 60 disposed over the SOI active layer 83.

In the oxide isolation region 7 between the first and the second field shield region 5 and 6, the lower part of the oxide isolation film 70 is formed within the SOI active layer 83. The field shield gate electrodes 51 and 61 are each truncated at the tips of bird's beaks 701 and 702 of the oxide isolation film 70.

In the peripheral circuits of the first-embodiment DRAM, as described, the N-channel transistor regions NT are isolated from one another by the first field shield region 5, and the P-channel transistor regions PT are isolated from one another by the second field shield region 6.

Because the transistor regions of the same polarity are isolated from one another by the field shield arrangement, each transistor region in the SOI active layer 83 is electrically connected by PN junction to an external region. This means that the potential in the body region of each MOS transistor is fixed.

With the body region potential fixed, it is possible to prevent the deterioration of withstanding voltage, the incidence of leak currents between the source and the drain, and the occurrence of kink, i.e., the undesirable phenomena attributable to the body region potential getting into a floating state. This allows the MOS transistors to operate in a stable manner.

Because the N-channel transistor regions NT are isolated by the oxide isolation region 7 from the adjacent P-channel transistor regions PT, it is possible to prevent the occurrence of latch-up. With the possibility of latch-up eliminated, the N-channel transistor regions NT and the P-channel transistor regions PT may be disposed the shortest possible distance apart. This contributes to minimizing the layout area and leads to implementing higher degrees of circuit integration.

As described, the first embodiment provides the benefits of fixing the body potential, suppressing latch-up, and minimizing the increase in layout area.

Second Embodiment

The second embodiment of the invention will now be described. The SOI-structure DRAM of the second embodiment is characterized by the boundary between the first and the second field shield regions 5 and 6 on one hand, and the oxide isolation region 7 on the other hand. The description of the second embodiment will highlight its peripheral circuits.

Figure 6:
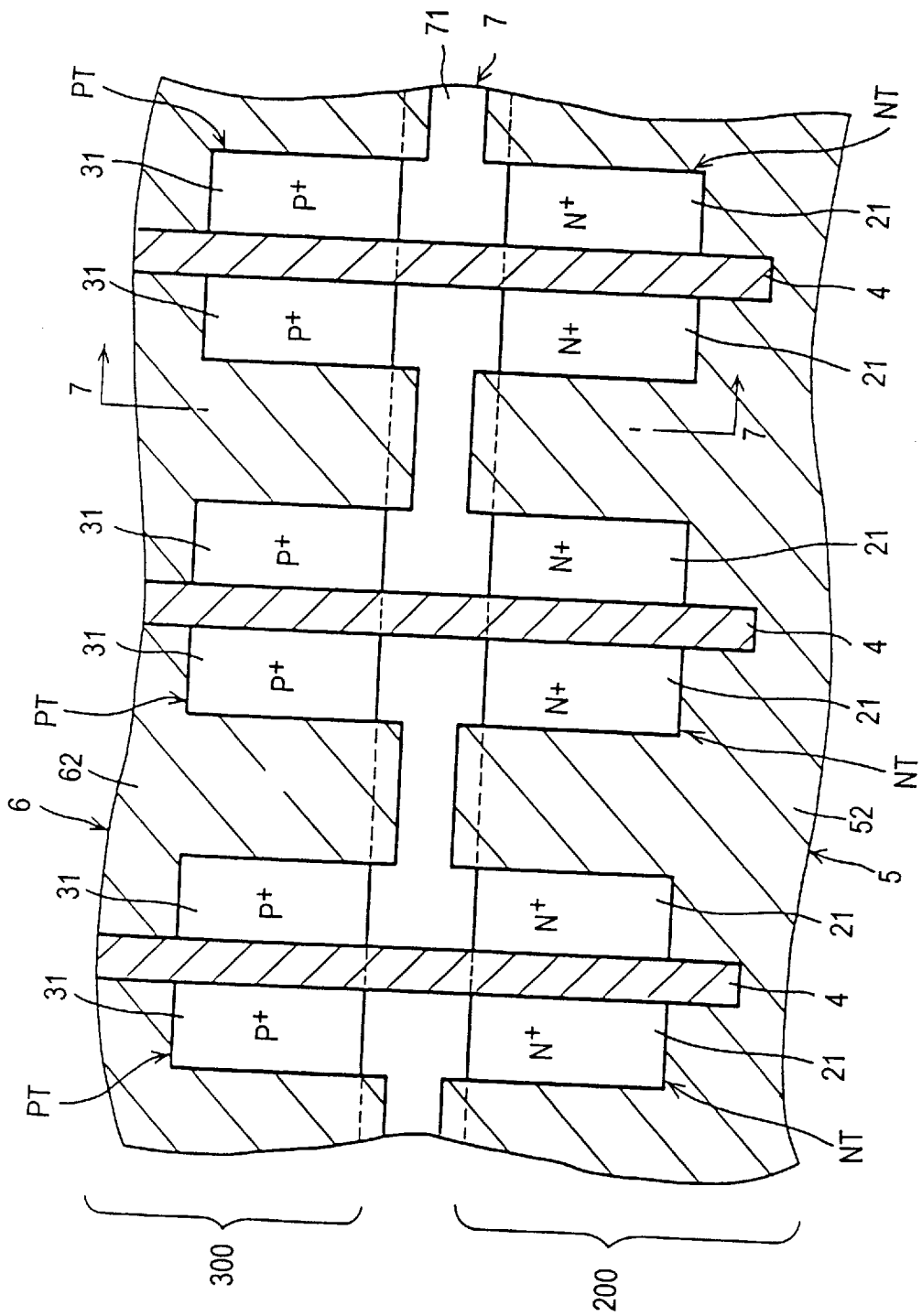
FIG. 6 is a plan view of part of peripheral circuits in a DRAM practiced as a second embodiment of the invention.

FIG. 6 is a plan view of part of the peripheral circuits in a DRAM practiced as the second embodiment of the invention. FIG. 6 shows a portion corresponding to that depicted in FIG. 2. Of the component parts in FIG. 6, those commonly shown in FIG. 2 are designated by like reference numerals and their descriptions are omitted where redundant.

Referring to FIG. 6, the first field shield region 5 includes a field shield gate electrode 52. The second field shield region 6 includes a field shield gate electrode 62. The oxide isolation region 7 comprises the oxide isolation film 71.

In FIG. 6, the emphasis is on the boundary between the first and the second field shield region 5 and 6 on one hand, and the oxide isolation region 7 on the other hand. Along that boundary, the first field shield region 5 overlaps partially with the oxide isolation region 7. Likewise, the second field shield region 6 overlaps partially with the oxide isolation region 7 along the same boundary.

Figure 7:
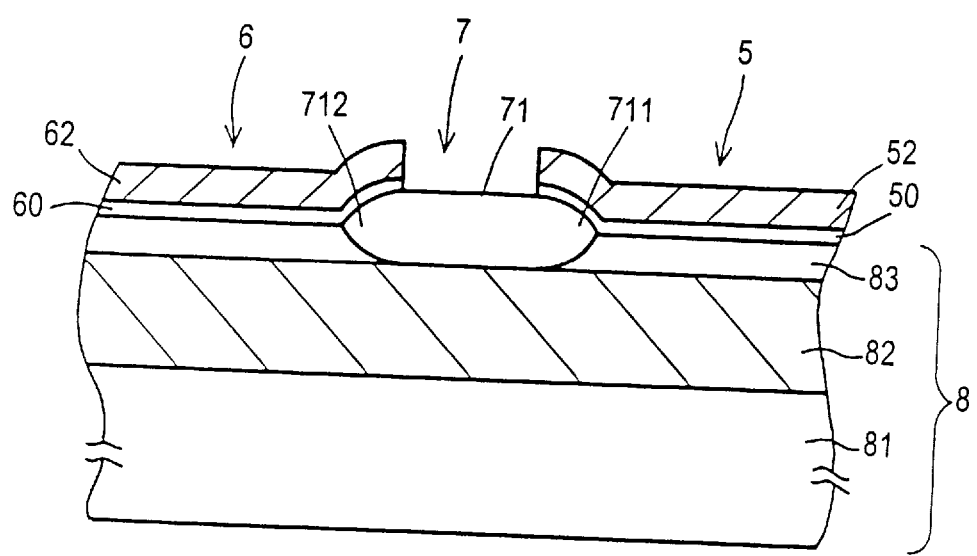
FIG. 7 is a cross-sectional view taken on line D—D in FIG. 6.

A cross section whose location is indicated in FIG. 6 will now be described in terms of its structure. FIG. 7 is a cross-sectional view taken on line D—D in FIG. 6. The cross-sectional view of FIG. 7 depicts the boundary between the first and the second field shield region 5 and 6 on one hand, and the oxide isolation region 7 on the other hand. That is, FIG. 7 illustrates that portion of the second embodiment which corresponds to what is shown in FIG. 5.

Referring to FIG. 7, the field shield gate electrode 52 and gate oxide film 50 in the first field shield region 5 extend over a bird's beak 711 of the oxide isolation film 71. The field shield gate electrode 62 and gate oxide film 60 in the second field shield region 6 extend over a bird's beak 712 of the oxide isolation film 71.

As described, the structure of FIG. 7 is characterized by the field shield gate electrode 52 extending over the bird's beak 711 and by the field shield region 62 extending over the bird's beak 712. This structure suppresses leak currents that can occur between the bird's beaks 711 and 712 on one hand, and the SOI active layer 83 in contact therewith on the other hand.

Leak currents of the type mentioned above are liable to occur for the following reason:

suppose that no field shield gate electrode exists over the bird's beaks 711 and 712 of the oxide isolation film 71 (and that the oxide isolation film 71 still has the bird's beaks 711 and 712).

The SOI active layer 83 extends partially into the underside of, and close to, the bird's beaks 711 and 712. That is, the SOI active layer 83 exists partially under the bird's beaks 711 and 712.

In that case, if the field shield gate electrodes 52 and 62 are truncated at the tips of the bird's beaks 711 and 712 respectively, the shielding effect of the field shield gate electrodes 52 and 62 will not work in the SOI active layer 83 under the bird's beaks 711 and 712. This can let leak currents occur in the SOI active layer 83 under the bird's beaks 711 and 712.

With the second embodiment, the field shield gate electrodes 52 and 62 extend over the bird's beaks 711 and 712 respectively. This arrangement causes the shielding effect of these electrodes to work in the SOI active layer 83 under the bird's beaks 711 and 712. As a result, the leak currents mentioned above are suppressed.

Third Embodiment

The third embodiment of the invention will now be described. The SOI-structure DRAM of the third embodiment is also characterized by the boundary between the first and the second field shield regions 5 and 6 on one hand, and the oxide isolation region 7 on the other hand. The description of the third embodiment will emphasize its peripheral circuits.

Figure 8:
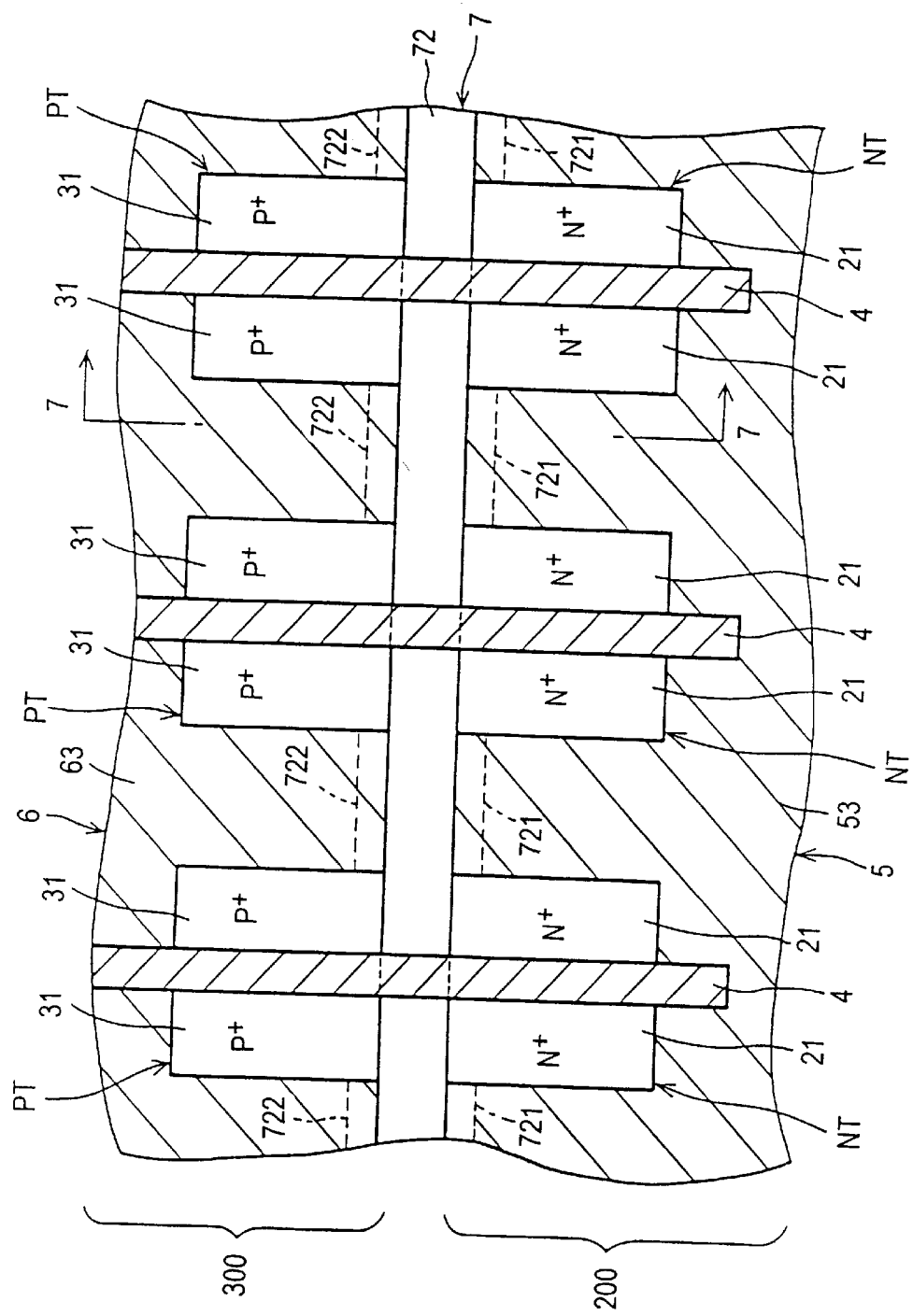
FIG. 8 is a plan view of part of peripheral circuits in a DRAM practiced as a third embodiment of the invention.

FIG. 8 is a plan view of part of the peripheral circuits in a DRAM practiced as the third embodiment of the invention. FIG. 8 shows a portion corresponding to those depicted in FIGS. 2 and 6. Of the component parts in FIG. 8, those commonly shown in FIGS. 2 and 6 are designated by like reference numerals and their descriptions are omitted where redundant.

Referring to FIG. 8, the first field shield region 5 includes a field shield gate electrode 53. The second field shield region 6 includes a field shield gate electrode 63. The oxide isolation region 7 comprises an oxide isolation film 72.

In FIG. 8, the emphasis is also on the boundary between the first and the second field shield region 5 and 6 on one hand, and the oxide isolation region 7 on the other hand. Along that boundary, the first field shield region 5 overlaps partially with the oxide isolation region 7. Likewise, the second field shield region 6 overlaps partially with the oxide isolation region 7 along the same boundary.

What makes the structure of FIG. 8 different from that of FIG. 6 is that the oxide isolation film 72 has two kinds of projections: a projection 721 protruding on the side of the first field shield region 5, and a projection 722 sticking out on the side of the second field shield region 6.

With respect to that part of the oxide isolation film 72 which extends along the boundary with the first field shield region 5, the projection 721 sticks out under the field shield gate 53. Regarding that part of the oxide isolation film 72 which extends along the boundary with the second field shield region 6, the projection 722 protrudes under the field shield gate electrode 63.

The oxide isolation film 72 has the two kinds of projections 721 and 722, as described. It follows that the bird's beaks of the oxide isolation film 72 along the boundary between the first and the second field shield region 5 and 6 on one hand, and the oxide isolation region 7 on the other, are located under the field shield gate electrodes 53 and 63.

As a result, the cross-sectional view taken on line E—E in FIG. 8 is identical to that in FIG. 7. This cross-sectional view along line E—E will thus be omitted.

Constituted as described, the third embodiment of the invention offers the same benefits as the second embodiment. That is, the third embodiment suppresses leak currents that can occur near the bird's beaks of the oxide isolation film 72.

Fourth Embodiment

The fourth embodiment of the invention will now be described.

The DRAMs of the SOI structure practiced as the first through the third embodiment are arranged intrinsically to exclude the presence of wells. Without the well structure, these embodiments are capable of suppressing the occurrence of latch-up. It should be noted, however, that the transistor regions of the SOI structure are subject to the deterioration of transistor characteristics unless the potential in the body regions is fixed.

Where transistors and like components are to be isolated from one another by the field shield isolation method, it is easy to fix the potential in the body regions of the transistor regions as described above. However, there is one problem that needs to be solved before the transistors and like components are adequately isolated from one another by the field shield isolation method.

The problem is as follows: it is necessary to provide first of all specific means for supplying a potential to the body regions of the transistor regions. Along the boundary between the N-channel transistor regions and the P-channel transistor regions, the field shield regions are separated. This is because the field shield gate electrodes of the field shield regions require being fed with different potentials with a view to isolating the N-channel transistor regions from the P-channel transistor regions. Thus the boundary portion should preferably be simplified structurally.

In general, the conventional bulk type semiconductor device has a problem with the structure of the boundary outlined above. This problem will now be described.

With the bulk type semiconductor device, wells are generally formed when N-channel MOS transistors and P-channel MOS transistors are fabricated. The two kinds of MOS transistors are furnished both in the area where the wells are formed and in the area where no such wells are provided.

To apply the field shield isolation method to the bulk type semiconductor device requires appropriately treating the tips of the wells. This requirement involves preparing a complicated structure. Furthermore, to improve the resistance to latch-up, the bulk type semiconductor device must allow for an appreciable clearance between the P-channel transistor regions and the N-channel transistor regions. This means an undesirable increase in the layout area of the device.

The fourth through the seventh embodiment described below are typical semiconductor devices aimed at supplementing the benefits of the first through the third embodiment (i.e., prevention of latch-up. reduced layout area) with at least one of the following features: implementation of specific means for supplying potentials to the body regions of the transistor regions, and simplification of the boundary structure between the N-channel transistor regions and the P-channel transistor regions.

Figure 9:
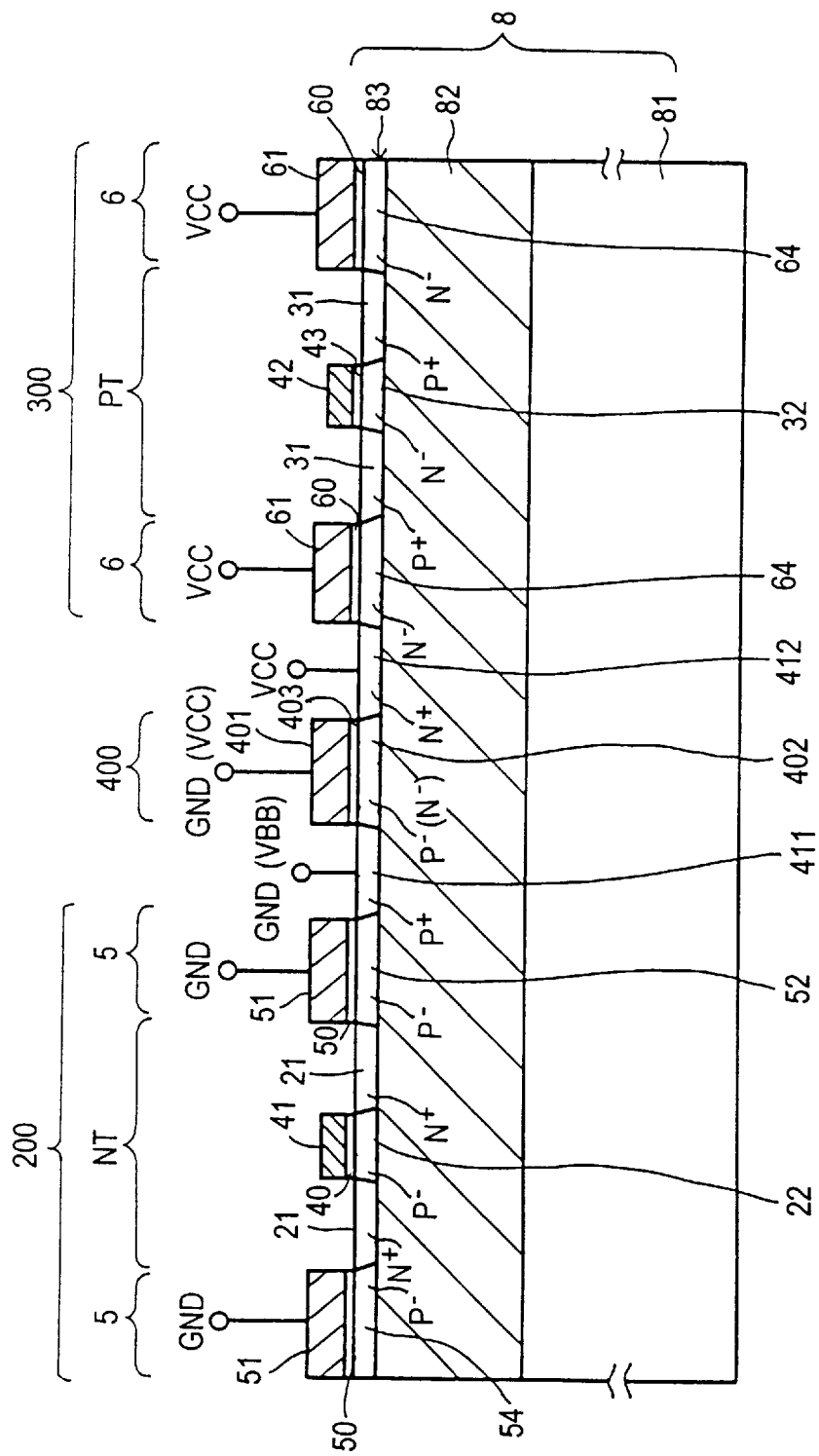
FIG. 9 is a cross-sectional view of a semiconductor device practiced as a fourth embodiment of the invention.

FIG. 9 is a cross-sectional view of a semiconductor device practiced as the fourth embodiment of the invention. Of the component parts in FIG. 9, those commonly included in the first through the third embodiment are designated by like reference numerals and their descriptions are omitted where redundant.

Referring to FIG. 9, the N-channel transistor formation region 200 includes the N-channel transistor regions NT and the first field shield region 5, as with the preceding embodiments. The P-channel transistor formation region 300 comprises the P-channel transistor regions PT and the second field shield region 6, as in the case of the preceding embodiments.

In the SOI active layer 83 of the N-channel transistor formation region 200, areas 52 and body regions 23 are P– type impurity regions; source and drain regions 21 are N+ type impurity regions. On top of each body region 22 is a gate electrode 41 formed with the gate oxide film 40 interposed therebetween. On each region 54 is the field shield gate electrode 51 formed with a gate oxide film 50 disposed therebetween.

In the SOI active layer 83 of the P-channel transistor formation region 300, areas 64 and body regions 32 are N– type impurity regions; source and drain regions 31 are P+ type impurity regions. On top of each body region 32 is a gate electrode 42 formed with a gate oxide film 43 interposed therebetween. On each region 64 is the field shield gate electrode 61 formed with the gate oxide film 60 disposed therebetween.

The field shield gate electrode 51 receives a grounding potential GND. The field shield gate electrode 61 receives a supply potential VCC.

On the boundary between the N-channel transistor formation region 200 and the P-channel transistor formation region 300, an impurity region 411, a third field shield region 400 and an impurity region 412 are formed.

More specifically, the P+ type impurity region 411 is formed in the SOI active layer 83 in such a manner that one of the edges of the impurity region 411 is in contact with the region 54. In the SOI active layer 83, the N+ type impurity region 412 is formed so that one of the edges of the impurity region 412 contacts the region 64. The impurity regions 411 and 412 are furnished a predetermine distance apart.

The third field shield region 400 includes a field shield gate electrode 401, an impurity region 402 and a gate oxide film 403. In the SOI active layer 83, the P– type (or N– type) impurity region 402 is interposed between the impurity regions 411 and 412. On top of the impurity region 402 is the field shield gate electrode 401 with the gate oxide film 403 interposed therebetween.

The impurity region 411 is supplied with the grounding potential GND (or potential VBB) for fixing the potential in the body regions 22 of the N-channel transistor regions NT. The impurity region 412 is fed with the supply potential VCC for fixing the potential in the body regions 32 of the P-channel transistor regions PT. The field shield gate electrode 401 receives the grounding potential GND (or supply potential VCC) for isolating the impurity region 411 from the impurity region 412.

Figure 10:
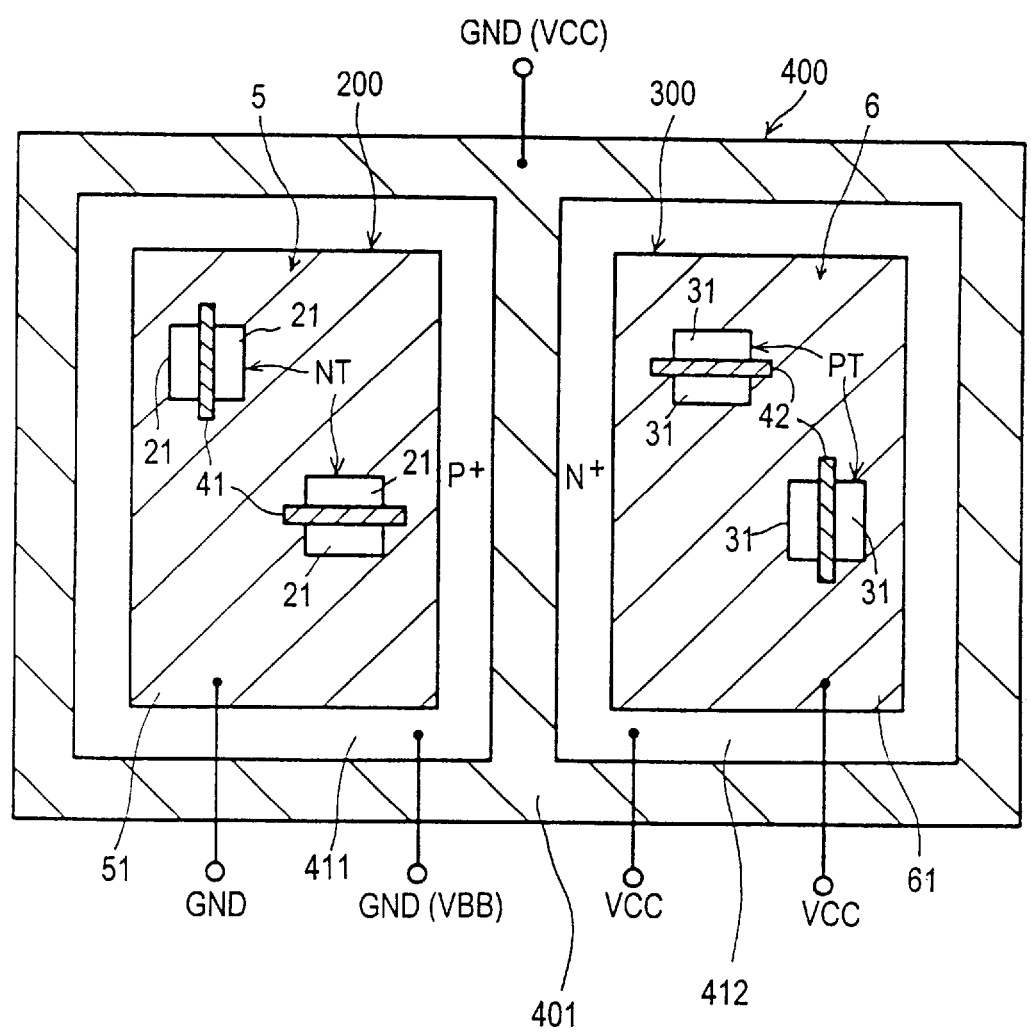
FIG. 10 is a plan view of the fourth embodiment.

The level layout of the semiconductor device in FIG. 9 will now be described. FIG. 10 is a plan view of the semiconductor device practiced as the fourth embodiment. Of the component parts in FIG. 10, those commonly shown in FIG. 9 are designated by like reference numerals and their descriptions are omitted where redundant.

Referring to FIG. 10, the N-channel transistor formation region 200 comprises a plurality of N-channel transistor regions NT. The P-channel transistor formation region 300 includes a plurality of P-channel transistor regions PT.

The impurity region 411 is so disposed as to surround the N-channel transistor formation region 200. The impurity region 412 is furnished so as to surround the P-channel transistor formation region 300. The third field shield region 400 surrounds both impurity regions 411 and 412.

In the semiconductor device of FIG. 9 thus constituted, the potentials in the body regions 22 and 32 are fixed as follows: the grounding potential GND fed to the impurity region 411 is forwarded to the body regions 22 via the regions 54. This fixes the potential in the body regions 22 of the N-channel transistor regions NT.

On the other hand, the supply potential VCC fed to the impurity region 412 is given to the body regions 32 via the regions 64. This fixes the potential in the body regions 32 of the P-channel transistor regions PT.

The semiconductor device of FIG. 9 fixes the potentials in the body regions 22 and 32 specifically by having the impurity regions 411 and 412 as well as the third field shield region 400 furnished as described.

Suppose that a P+ type impurity region such as the impurity region 411 is in direct contact with an N+ type impurity region like the impurity region 412. In that case, the portion composed of such high-density PN junction has a low withstanding voltage. For this reason, leak currents can occur if, in order to fix the body region potentials, the P+ type impurity region is supplied with the grounding potential GND, and the N+ type impurity region with the supply potential VCC.

The problem above is circumvented by the semiconductor device of FIG. 9 having the third field shield region 400 interposed between the impurity regions 411 and 412.

In addition, the semiconductor device of FIG. 9 fixes the potentials in the body regions 22 and 32 using a simplified structure, i.e., one that simply furnishes the impurity regions 411 and 412 as well as the third field shield region 400 along the boundary between the N-channel transistor formation region 200 and the P-channel transistor formation region 300. In this manner, the fourth-embodiment semiconductor device of FIG. 9 has its boundary structure simplified.

The SOI-structure semiconductor device of the above type includes no wells. This eliminates the need for furnishing a layout that would provide for the resistance to latch-up. It follows that the N-channel transistor formation region 200 and the P-channel transistor formation region 300 may be disposed the shortest manufacturable distance apart. This contributes to minimizing the layout area of the semiconductor device in FIG. 9.

If the impurity regions 411 and 412 are assumed to be in contact with each other, they short-circuit completely in a structure where a poly-pad is formed uniformly over the SOI active layer 83. In such a structure, the body regions 22 and 32 will short-circuit. This problem also arises in a structure where the top of the SOI active layer 83 is covered uniformly with a silicide coating.

By contrast, the semiconductor device of FIG. 9 comprises the third field shield region 400 that prevents the impurity regions 411 and 412 from getting short-circuited. This effectively eliminates the possibility of the short-circuiting of the body regions mentioned above.

What follows is a description of variations of the semiconductor device in FIG. 9. One variation involves disposing a poly-pad over the SOI active layer 83. Another variation is a structure in which the top of the SOI active layer 83 is covered uniformly with a silicide coating.

Figure 11:
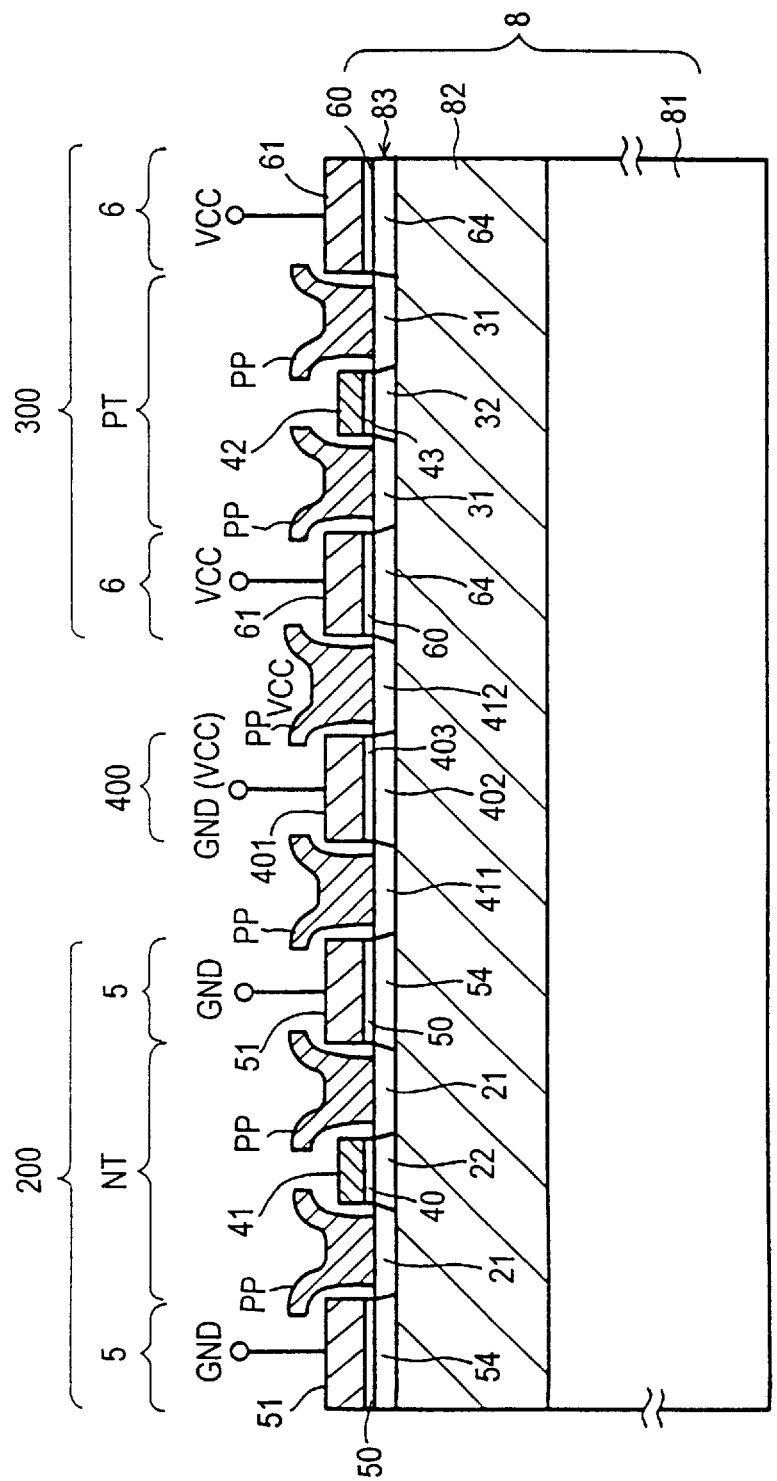
FIG. 11 is a cross-sectional view of a first variation of fourth embodiment.

FIG. 11 is a cross-sectional view of the first variation of the fourth embodiment. Of the component parts in FIG. 11, those commonly shown in FIG. 9 are designated by like reference numerals and their descriptions are omitted where redundant.

Referring to FIG. 11, a poly-pad PP is formed over the source and drain regions 21, the impurity regions 411 and 412, and the source and drain regions 31. In this structure, the presence of the poly-pad PP does not let the impurity regions 411 and 412 short-circuit.

Figure 12:
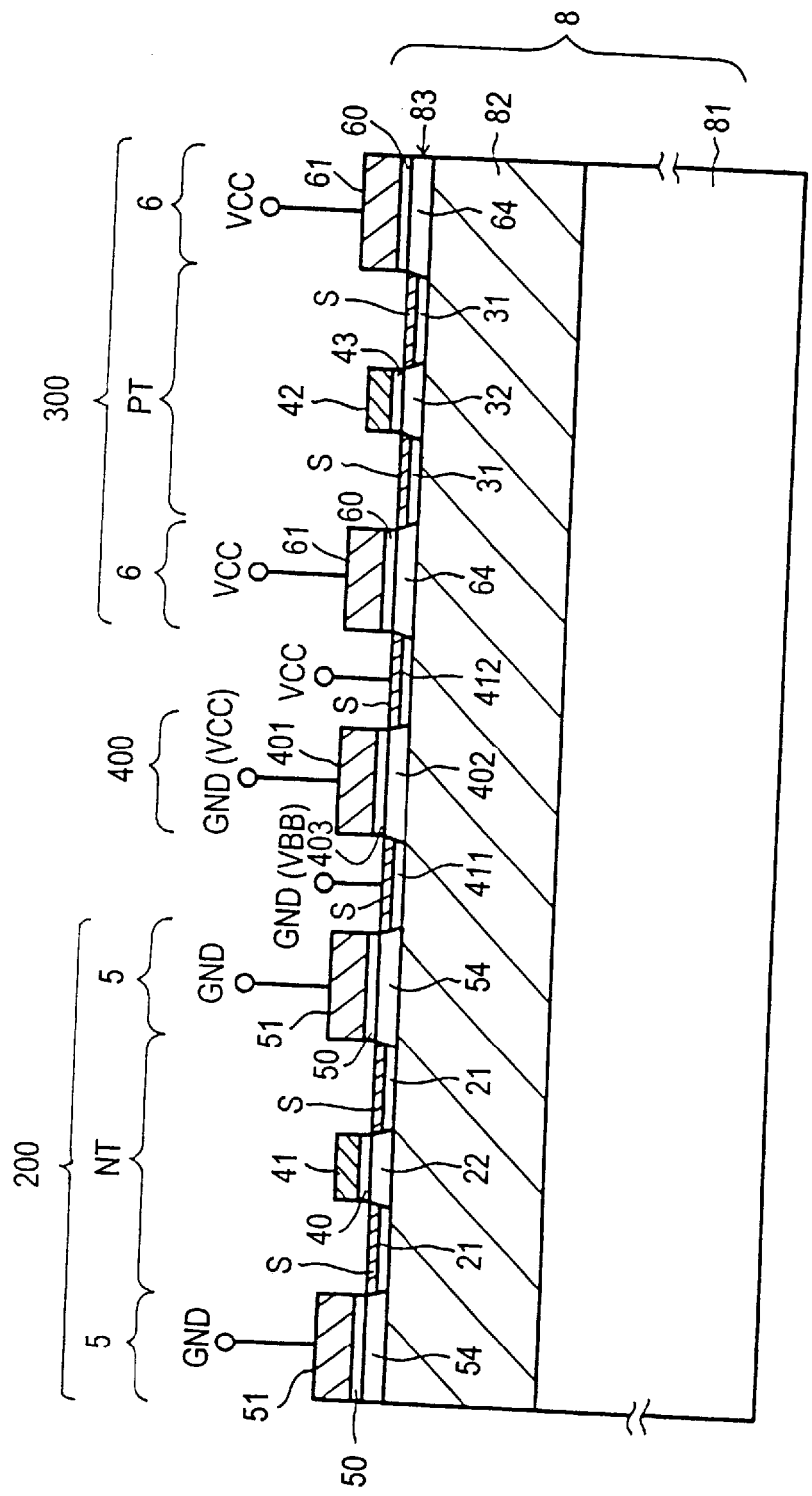
FIG. 12 is a cross-sectional view of a second variation of the fourth embodiment.

FIG. 12 is a cross-sectional view of the second variation of the fourth embodiment. Of the component parts in FIG. 12, those commonly shown in FIG. 9 are designated by like reference numerals and their descriptions are omitted where redundant.

Referring to FIG. 12, a silicide layer S is formed over the source and drain regions 21, the impurity regions 411 and 412, and the source and drain regions 31. In this structure, the presence of the silicide layer S does not let the impurity regions 411 and 412 short-circuit.

Fifth Embodiment

The fifth embodiment of the invention will now be described. This embodiment is in fact a simplified version of the fourth embodiment.

Figure 13:
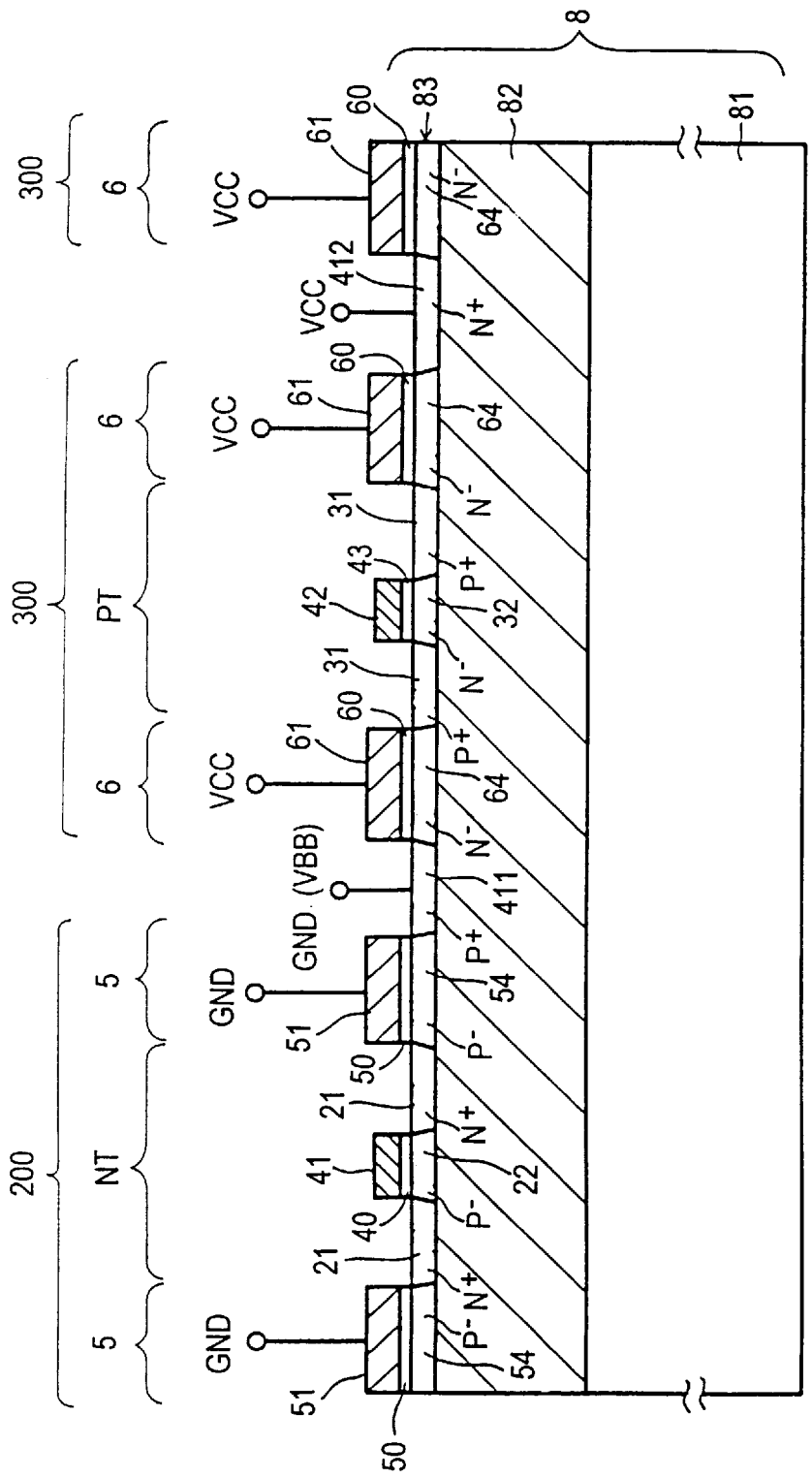
FIG. 13 is a cross-sectional view of a semiconductor device practiced as a fifth embodiment of the invention.

FIG. 13 is a cross-sectional view of a semiconductor device practiced as the fifth embodiment of the invention. Of the component parts in FIG. 13, those commonly shown in FIG. 9 are designated by like reference numerals and their descriptions are omitted where redundant.

What makes the semiconductor device in FIG. 13 different from that in FIG. 9 is as follows: the third field shield region 400 does not exist in the semiconductor device of FIG. 13. Furthermore, the impurity regions 411 and 412 are disposed so as to flank the P-channel transistor formation region 300.

Structural characteristics of the fifth embodiment will now be described in detail. The impurity region 411 is formed along the boundary between the N-channel transistor formation region 200 and the P-channel transistor formation region 300. More specifically, the impurity region 411 is interposed between the region 54 of the first field shield region 5 and the region 64 of the second field shield region 6.

In the P-channel transistor formation region 300, the impurity region 412 is formed illustratively in an area free of the P-channel transistor regions PT. More specifically, part of the P-channel transistor formation region 300 constitutes an area free of the field shield gate electrode 61.

The impurity region 412 is formed in an exposed SOI active layer 83 free of the field shield gate electrode 61. That is, in the SOI active layer 83, the impurity region 412 is surrounded by the regions 64.

Figure 14:
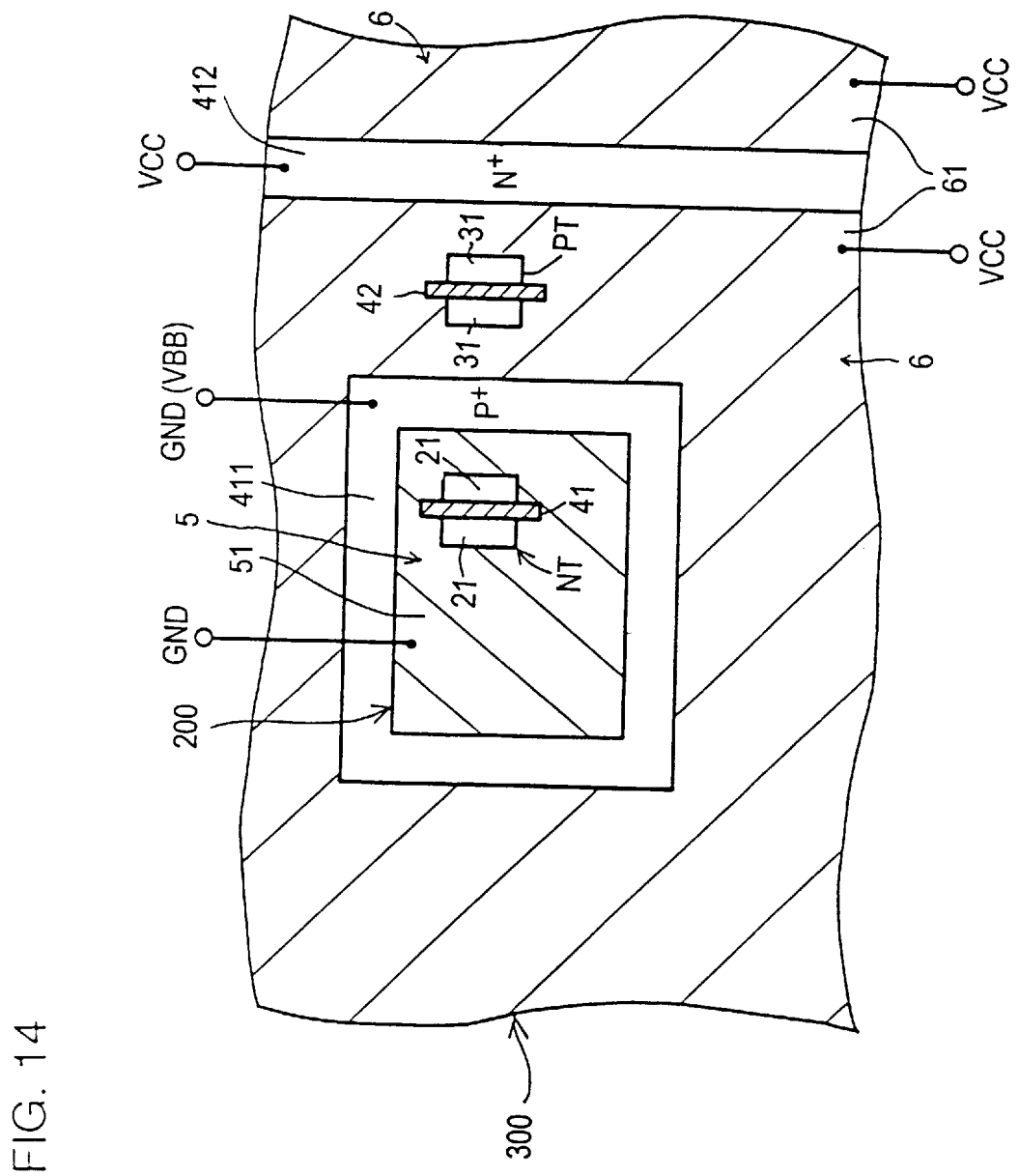
FIG. 14 is a plan view of the fifth embodiment.

Below is a description of a level layout of the semiconductor device in FIG. 13. FIG. 14 is a plan view of the semiconductor device practiced as the fifth embodiment. Of the component parts in FIG. 14, those commonly shown in FIG. 13 are designated by like reference numerals.

Referring to FIG. 14, the N-channel transistor formation region 200 is formed in part of the P-channel transistor formation region 300. The impurity region 411 surrounds the N-channel transistor formation region 200.

The impurity region 412 is disposed within the P-channel transistor formation region 300. In this structure, the P-channel transistor formation region 300 is interposed between the impurity regions 411 and 412.

With this semiconductor device, the potentials in the body regions 22 and 32 are fixed as follows: the grounding potential GND (or potential VBB) fed to the impurity region 411 is forwarded to the body regions 22 via the regions 54. This fixes the potential in the body regions 22 of the N-channel transistor regions NT.

On the other hand, the potential supplied to the impurity region 412 is given to the body regions 32 via the regions 64. This fixes the potential in the body regions 32 of the P-channel transistor regions PT.

The semiconductor device of FIG. 13 fixes the potentials in the body regions 22 and 32 specifically by having the impurity regions 411 and 412 disposed so as to flank the P-channel transistor formation region 300 as described.

In the semiconductor device of FIG. 14, the impurity region 411 is formed along the boundary between the N-channel transistor formation region 200 and the P-channel transistor formation region 300. The impurity region 412 is furnished in such a manner that the P-channel transistor formation region 300 is interposed between the impurity regions 411 and 412. This simplified structure still fixes the potentials in the body regions 22 and 32.

In this manner, the semiconductor device in FIG. 13 has a simplified boundary structure between the N-channel transistor formation region 200 and the P-channel transistor formation region 300.

The above-described SOI-structure semiconductor device has no wells. This eliminates the need for furnishing a layout that would provide for the resistance to latch-up. It follows that the N-channel transistor formation region 200 and the P-channel transistor formation region 300 may be disposed the shortest manufacturable distance apart. This contributes to minimizing the layout area of the semiconductor device in FIG. 13.

Furthermore, in the P-channel transistor formation region 300 of the semiconductor device in FIG. 13, the impurity region 412 is formed in an area free of the P-channel transistor regions PT. This structure makes the fifth embodiment even smaller in layout area than the fourth embodiment.

In the semiconductor device of FIG. 13, the impurity regions 411 and 412 are formed a predetermined distance apart. This prevents the impurity regions 411 and 412 from getting short-circuited in the structure where the top of the SOI active layer 83 is uniformly covered with a poly-pad or with a silicide coating. Hence there occurs no problem related to that short-circuiting of the impurity regions 411 and 412 which was discussed in connection with the fourth embodiment.

Below is a description of variations of the semiconductor device in FIG. 13. One variation involves disposing a poly-pad uniformly over the SOI active layer 83. Another variation is a structure in which the top of the SOI active layer 83 is covered uniformly with a silicide coating.

Figure 15:
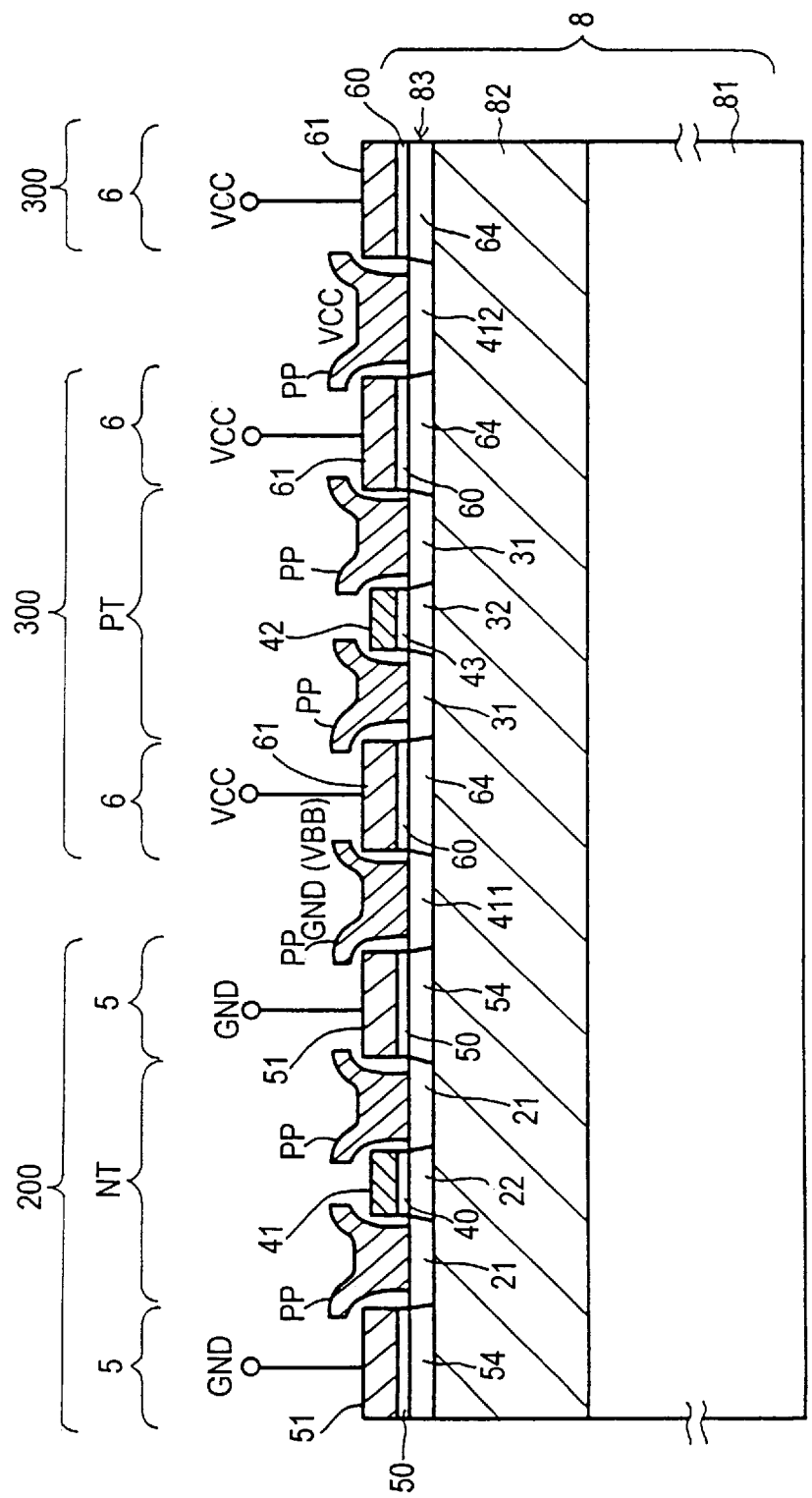
FIG. 15 is a cross-sectional view of a first variation of the fifth embodiment.

FIG. 15 is a cross-sectional view of the first variation of the fifth embodiment. Of the component parts in FIG. 15, those commonly shown in FIG. 13 are designated by like reference numerals and their descriptions are omitted where redundant.

Referring to FIG. 15, a poly-pad PP is formed over the source and drain regions 21, the impurity region 411, the source and drain regions 31, and the impurity region 412. In this structure, the impurity regions 411 and 412 are furnished a predetermined distance apart so that the poly-pad PP does not let them short-circuit.

Figure 16:
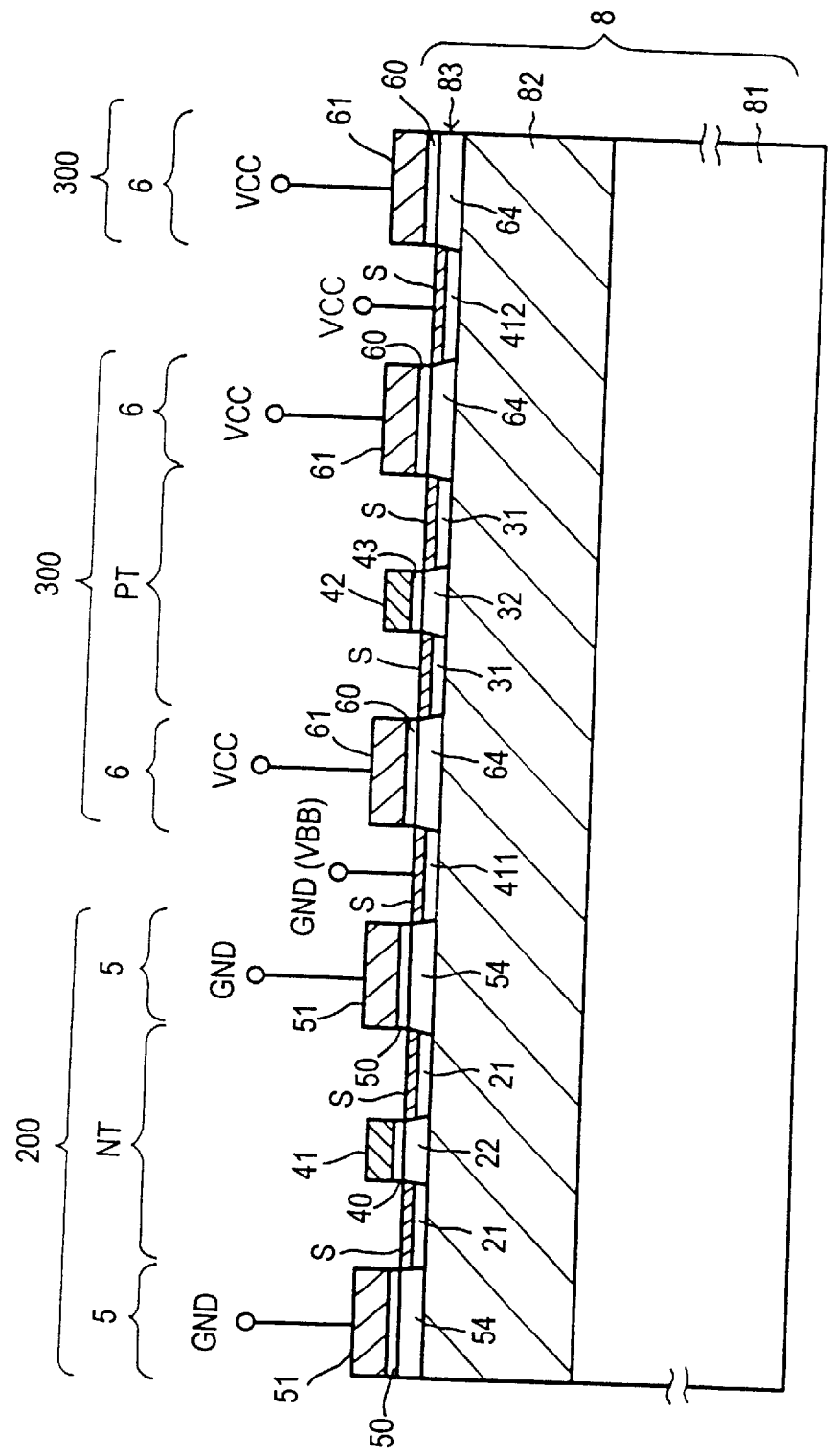
FIG. 16 is a cross-sectional view of a second variation of the fifth embodiment.

FIG. 16 is a cross-sectional view of the second variation of the fifth embodiment. Of the component parts in FIG. 16, those commonly shown in FIG. 13 are designated by like reference numerals and their descriptions are omitted where redundant.

Referring to FIG. 16, a silicide layer S is formed over the source and drain regions 21, the impurity region 411, the source and drain regions 31, and the impurity region 412. In this structure, the impurity regions 411 and 412 are separated from each other so that the silicide layer S does not let them short-circuit.

Sixth Embodiment

The sixth embodiment of the invention will now be described. This embodiment is in fact another simplified version of the fourth embodiment.

Figure 17:
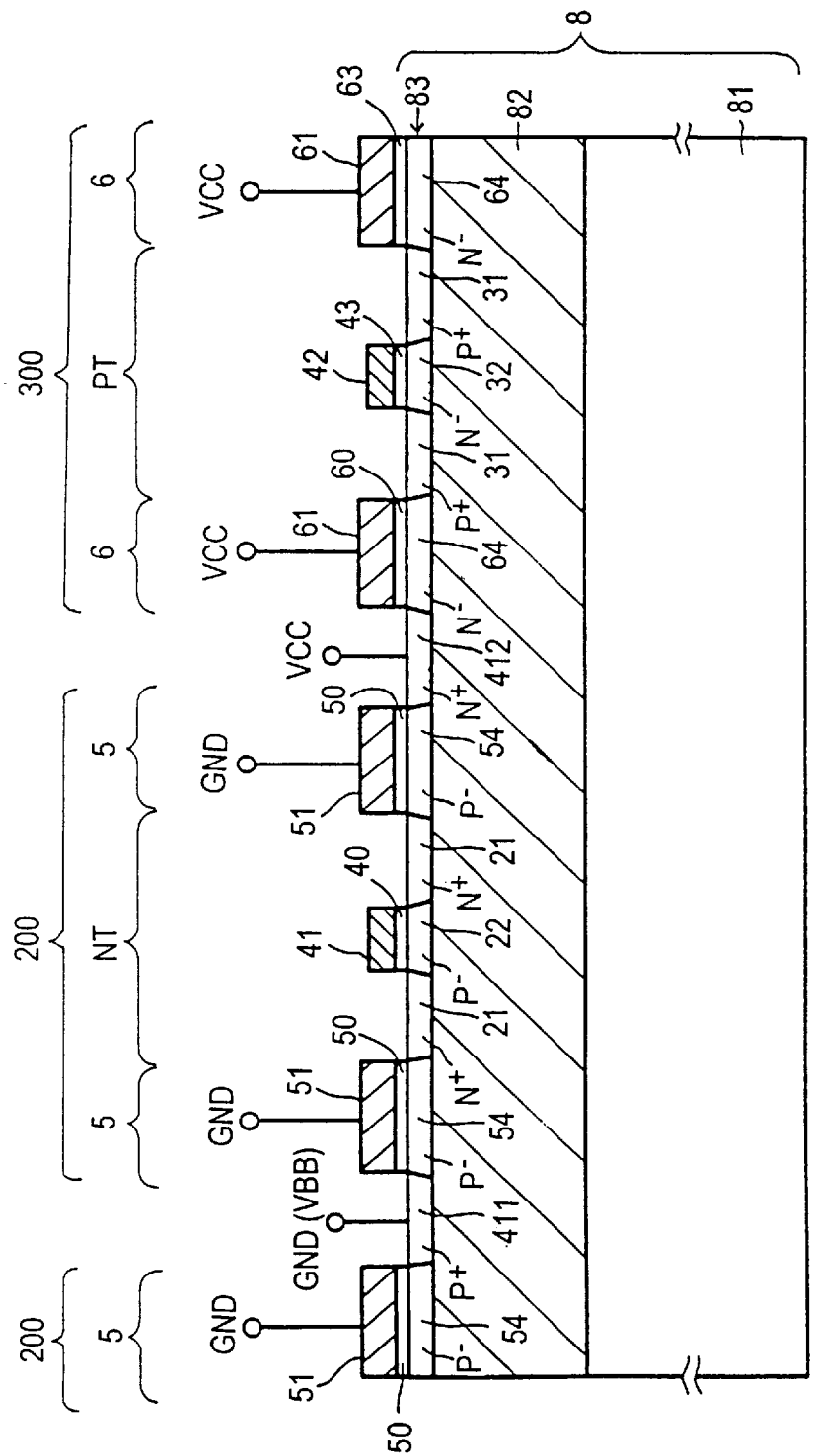
FIG. 17 is a cross-sectional view of a semiconductor device practiced as a sixth embodiment of the invention.

FIG. 17 is a cross-sectional view of a semiconductor device practiced as the sixth embodiment of the invention. Of the component parts in FIG. 17, those commonly shown in FIG. 9 are designated by like reference numerals and their descriptions are omitted where redundant.

What makes the semiconductor device in FIG. 17 different from that in FIG. 9 is as follows: the third field shield region 400 does not exist in the semiconductor device of FIG. 17. Furthermore, the impurity regions 411 and 412 are furnished so as to flank the N-channel transistor formation region 200.

Structural characteristics of the sixth embodiment will now be described in detail. The impurity region 412 is formed along the boundary between the N-channel transistor formation region 200 and the P-channel transistor formation region 300. More specifically, the impurity region 412 is interposed between the region 54 of the first field shield region 5 and the region 64 of the second field shield region 6.

In the N-channel transistor formation region 200, the impurity region 411 is formed illustratively in an area free of the N-channel transistor regions NT. More specifically, part of the N-channel transistor formation region 200 constitutes an area free of the field shield gate electrode 51. The impurity region 411 is formed in an exposed SOI active layer 83 free of the field shield gate electrode 51.

That is, in the SOI active layer 83, the impurity region 411 is surrounded by the regions 52.

Figure 18:
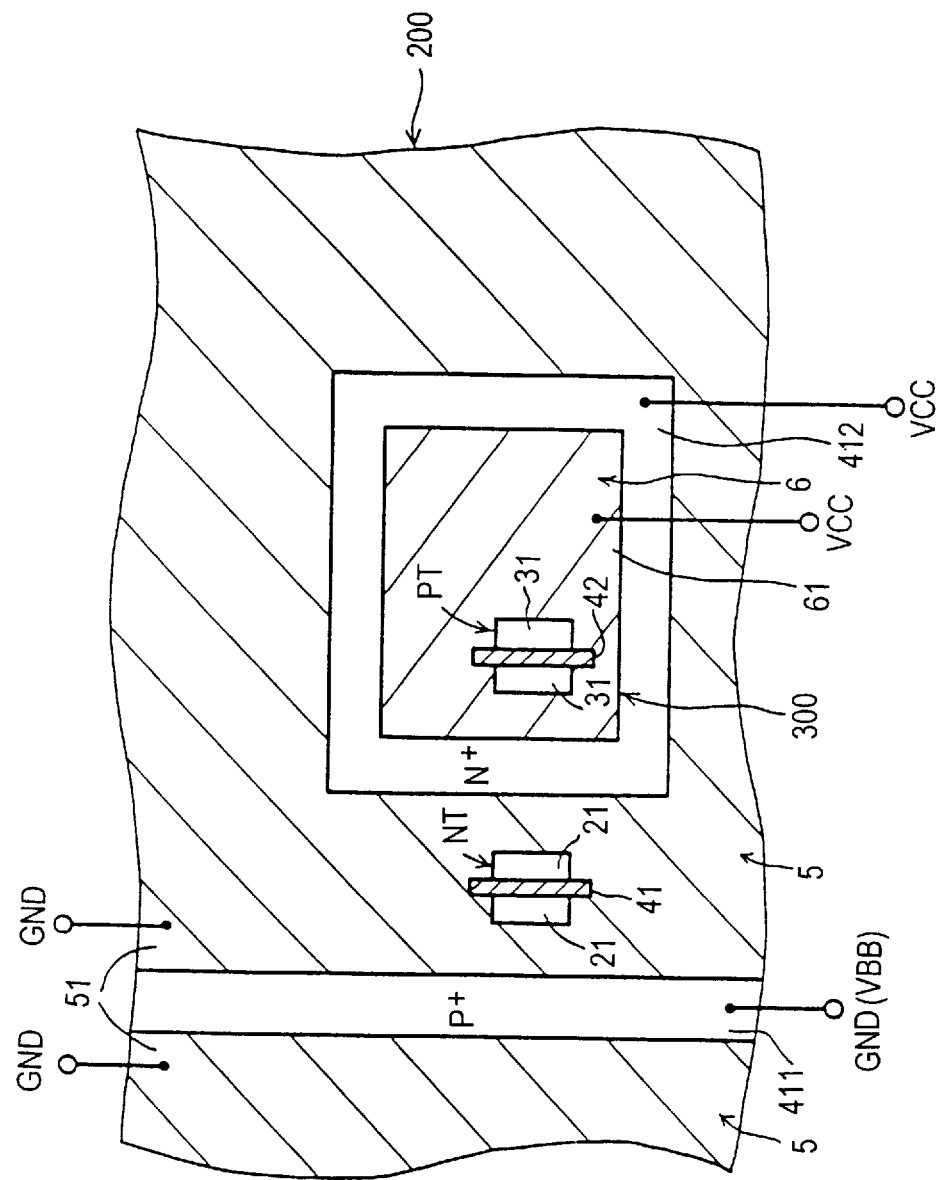
FIG. 18 is a plan view of the sixth embodiment.

Described below is a level layout of the semiconductor device in FIG. 17. FIG. 18 is a plan view of the semiconductor device practiced as the sixth embodiment. Of the component parts in FIG. 18, those commonly shown in FIG. 17 are designated by like reference numerals.

Referring to FIG. 18, the P-channel transistor formation region 300 is formed in part of the N-channel transistor formation region 200. The impurity region 412 surrounds the P-channel transistor formation region 300. The impurity region 411 is disposed within the N-channel transistor formation region 200. In this structure, the N-channel transistor formation region 200 is interposed between the impurity regions 411 and 412.

With this semiconductor device, the potentials in the body regions 22 and 32 are fixed as follows: the grounding potential GND (or potential VBB) fed to the impurity region 411 is forwarded to the body regions 22 via the regions 54. This fixes the potential in the body regions 22 of the N-channel transistor regions NT.

On the other hand, the supply potential VCC fed to the impurity region 412 is given to the body regions 32 via the regions 64. This fixes the potential in the body regions 32 of the P-channel transistor regions PT.

The semiconductor device of FIG. 17 fixes the potentials in the body regions 22 and 32 specifically by having the impurity region 412 interposed between the N-channel transistor formation region 200 and the P-channel transistor formation region 300, and by having the impurity region 411 disposed in such a manner that the N-channel transistor formation region 200 is flanked by the impurities 411 and 412.

In the semiconductor device of FIG. 17, the impurity region 412 is formed along the boundary between the N-channel transistor formation region 200 and the P-channel transistor formation region 300. The impurity region 411 is furnished in such a way that the N-channel transistor formation region 200 is flanked by the impurity regions 411 and 412. This simplified structure still fixes the potentials in the body regions 22 and 32.

In this manner, the semiconductor device in FIG. 17 has a simplified boundary structure between the N-channel transistor formation region 200 and the P-channel transistor formation region 300.

The SOI-structure semiconductor device described above has no wells. This eliminates the need for furnishing a layout that would provide for the resistance to latch-up. It follows that the N-channel transistor formation region 200 and the P-channel transistor formation region 300 may be disposed the shortest manufacturable distance apart. This contributes to minimizing the layout area of the semiconductor device in FIG. 17.

Furthermore, in the N-channel transistor formation region 200 of the semiconductor device in FIG. 17, the impurity region 411 is formed in an area free of the N-channel transistor regions NT. This structure makes the sixth embodiment even smaller in layout area than the fourth embodiment.

In the semiconductor device of FIG. 17, the impurity regions 411 and 412 are disposed so as to flank the N-channel transistor formation region 200. Hence there occurs no problem related to that short-circuiting of the impurity regions 411 and 412 which was discussed in connection with the fourth embodiment.

What follows is a description of variations of the semiconductor device in FIG. 17. One variation involves disposing a poly-pad uniformly over the SOI active layer 83. Another variation is a structure in which the top of the SOI active layer 83 is covered uniformly with a silicide coating.

Figure 19:
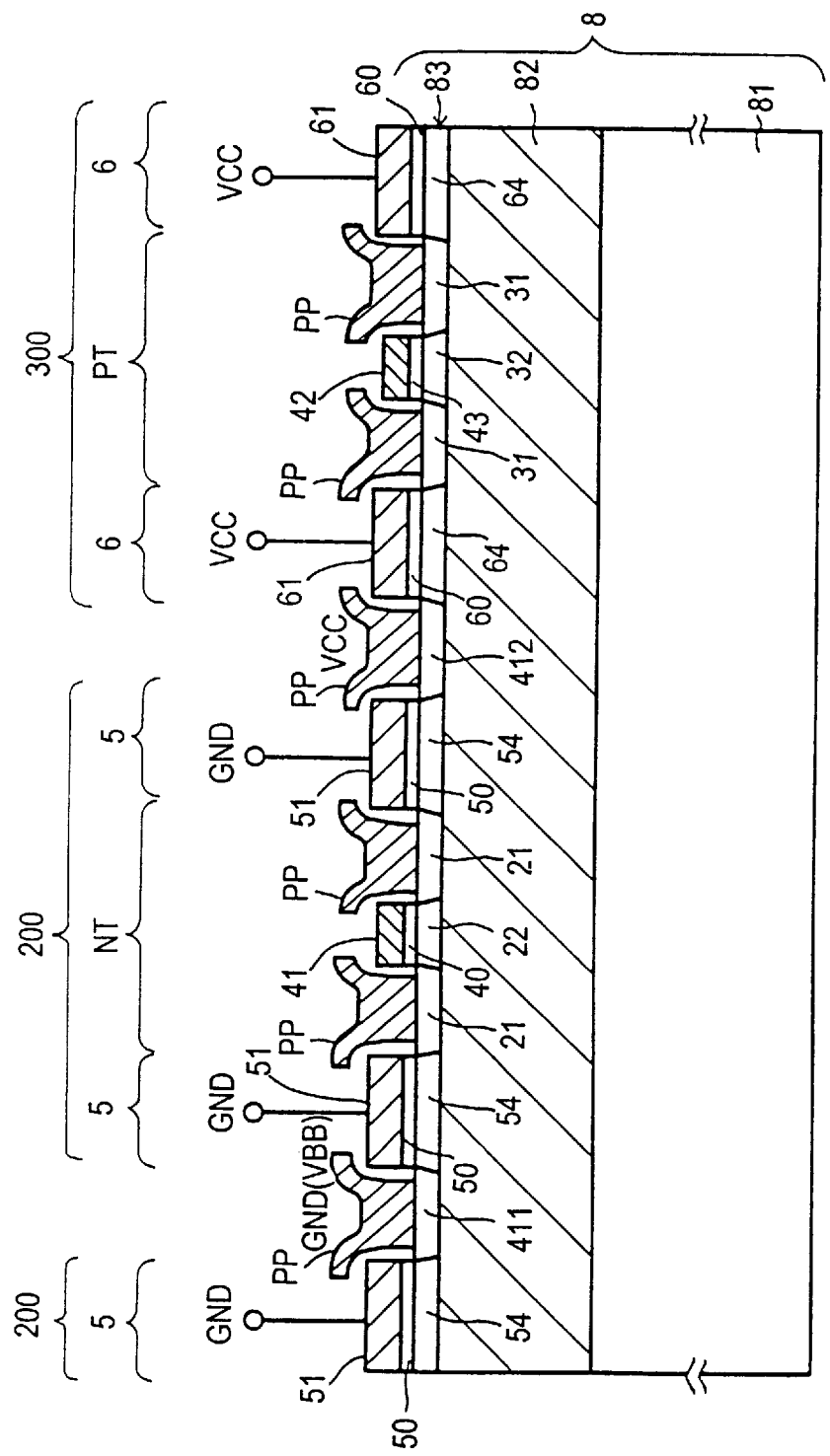
FIG. 19 is a cross-sectional view of a first variation of the sixth embodiment.

FIG. 19 is a cross-sectional view of the first variation of the sixth embodiment. Of the component parts in FIG. 19, those commonly shown in FIG. 17 are designated by like reference numerals and their descriptions are omitted where redundant.

Referring to FIG. 19, a poly-pad PP is formed over the impurity region 411, the source and drain regions 21, the impurity region 412, and the source and drain regions 31. In this structure, the impurity regions 411 and 412 are furnished a predetermined distance apart so that the poly-pad PP does not let them short-circuit.

Figure 20:
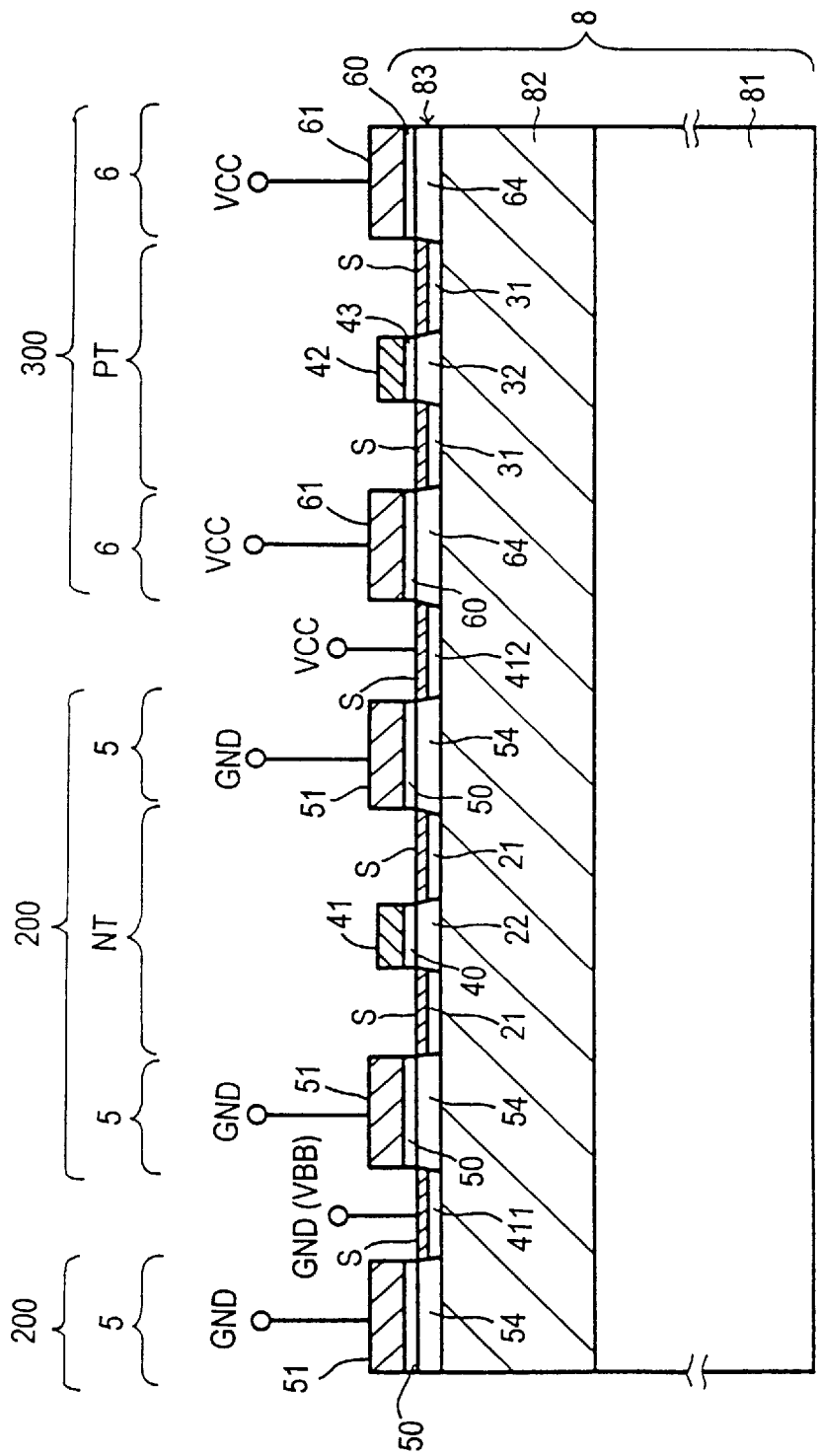
FIG. 20 is a cross-sectional view of a second variation of the sixth embodiment.

FIG. 20 is a cross-sectional view of the second variation of the sixth embodiment. Of the component parts in FIG. 20, those commonly shown in FIG. 17 are designated by like reference numerals and their descriptions are omitted where redundant.

Referring to FIG. 20, a silicide layer S is formed over the impurity region 411, the source and drain regions 21, the impurity region 412, and the source and drain regions 31. In this structure, the impurity regions 411 and 412 are separated from each other so that the silicide layer S does not let them short-circuit.

Seventh Embodiment

The seventh embodiment of the invention will now be described. This embodiment is another example of the semiconductor device wherein the potential in the body regions of the transistor regions is fixed. More specifically, the seventh embodiment is arranged to fix the potential in the body regions of the transistors within the memory cell array of the semiconductor device.

As with the fourth through the sixth embodiment of the invention, the location where the potential in the body regions of the transistor regions is to be fixed may be limited to the memory cell array of a DRAM or the like memory area where the fixing of the potential is required.

Figure 21:
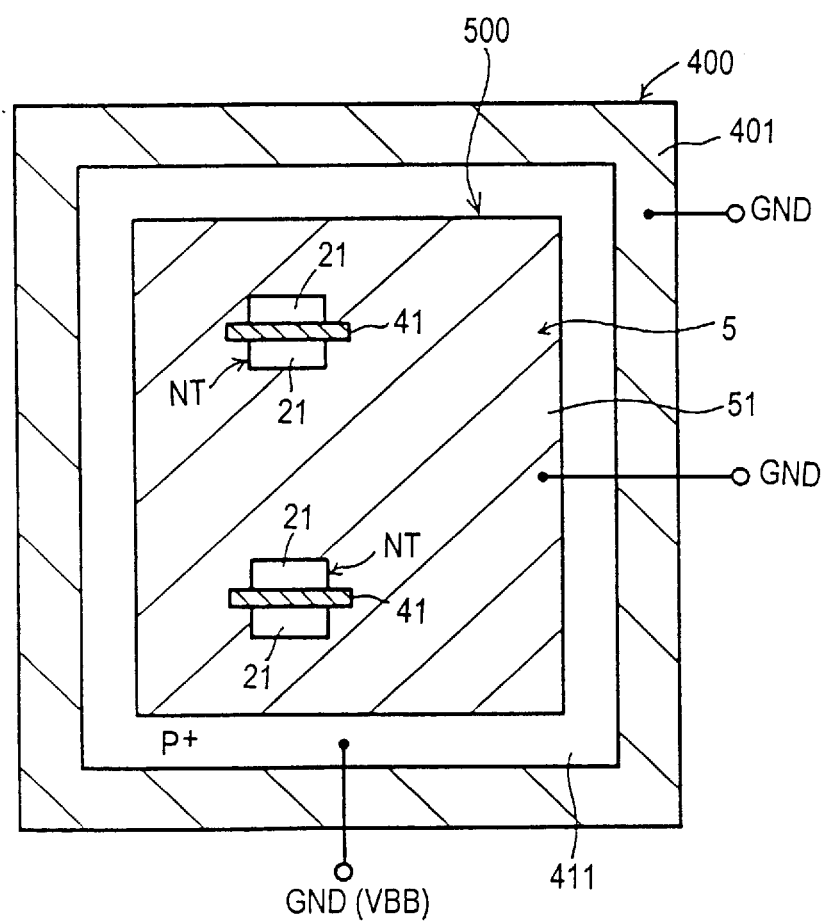
FIG. 21 is a plan view of key component parts of a semiconductor device practiced as a seventh embodiment of the invention.

FIG. 21 is a plan view of key component parts of a semiconductor device practiced as the seventh embodiment of the invention. In FIG. 21, the surroundings of the memory cell array region in the DRAM are illustrated. The memory cell array region 500 is an N-channel transistor formation region. Inside the memory cell array region 500 are a plurality of N-channel transistor regions NT, NT, etc. constituting the transfer gate transistors of the memory cells.

Each N-channel transistor region NT includes a source and a drain region 21 and a gate electrode 41. The N-channel transistor regions NT are isolated from one another by the field shield region 5 containing the field shield gate electrode 51.

The memory cell array region 500 is surrounded by the P+ type impurity region 411. In turn, the impurity region 411 is surrounded by the field shield region 400 comprising the field shield gate electrode 401.

The field shield gate electrode 51 is fed with the grounding potential GND for isolation purposes. The impurity region 411 is supplied with the grounding potential GND (or potential VBB) for fixing the potential in the body regions of the N-channel transistor regions NT. The field shield gate electrode 401 is supplied with the grounding potential GND (or potential VBB) for isolation purposes.

On the basis of the same principles as those of the fourth through the sixth embodiment, the seventh embodiment of FIG. 21 fixes the potential in the body regions of the N-channel transistor regions NT.

The memory cell array region 500 may alternatively be an area where P-channel transistor regions are formed. In that case, the following structure is adopted: the potential fed to the field shield region within the memory cell array region is used as the supply potential. The impurity region surrounding the memory cell array region is of N+ type and fed with the supply potential. Furthermore, the potential given to the field shield region surrounding this impurity region is used as the supply potential.

Figure 22:
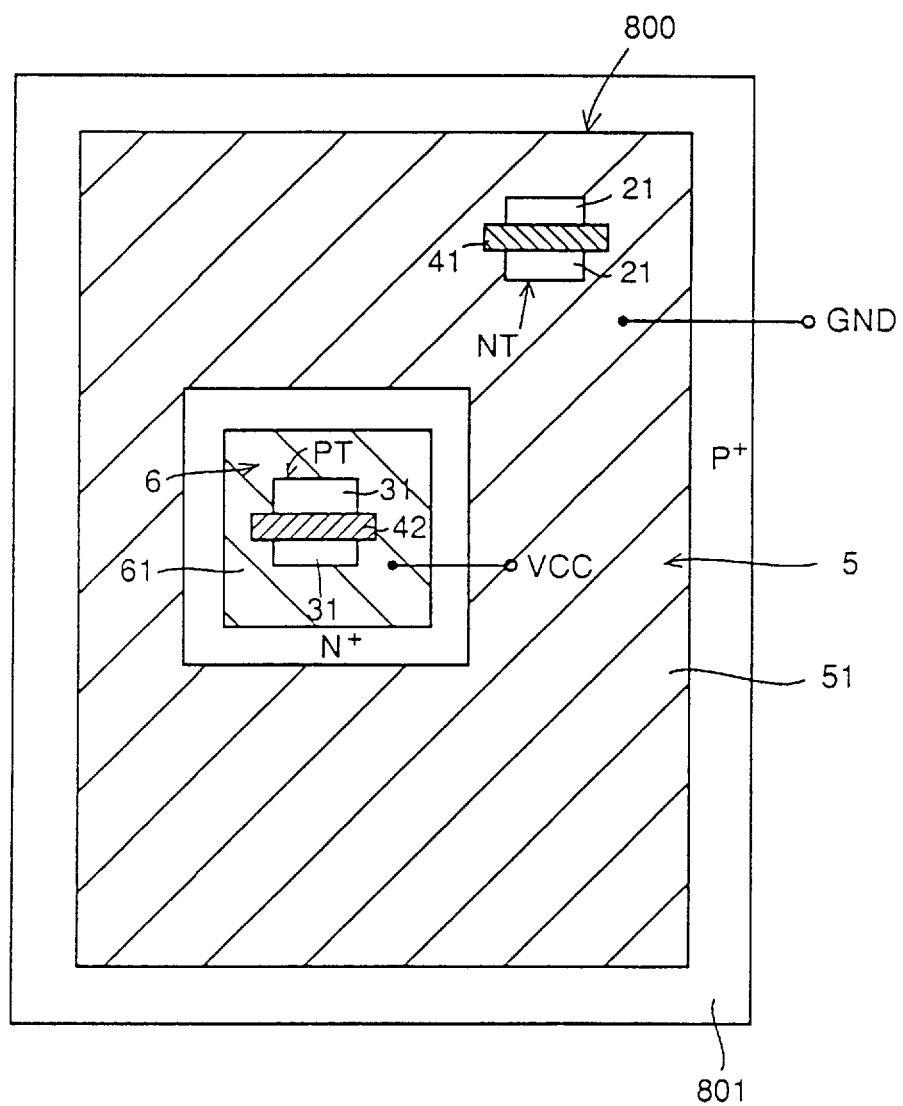
FIG. 22 is a plan view schematically showing the entirety of a semiconductor chip of the semiconductor device and the semiconductor memory device shown according to the first to seventh embodiments.
Figure 23:
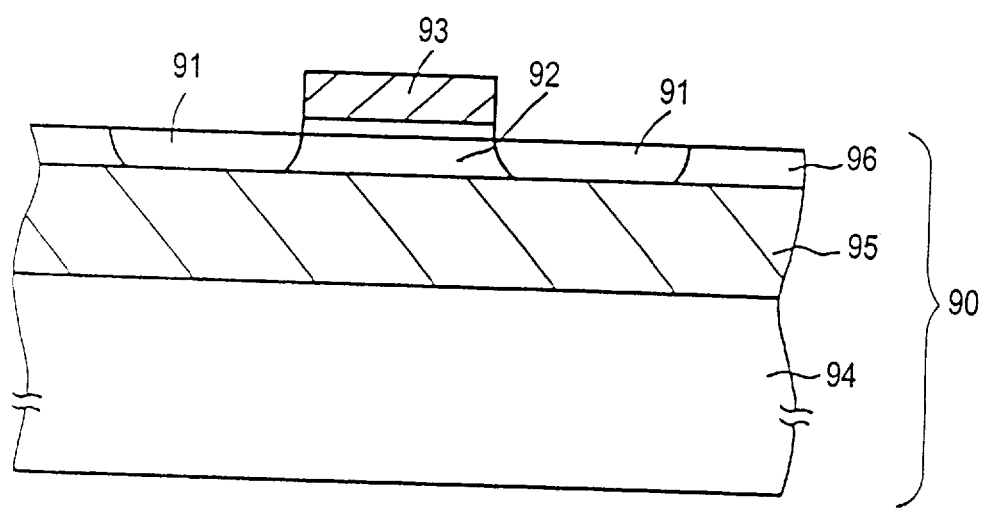
FIG. 23 is a cross-sectional view showing a typical constitution of an MOS transistor in a conventional SOI-structure semiconductor device.

A structure of the entire semiconductor chip of the semiconductor device and the semiconductor memory device of the first to seventh embodiments will be described hereinafter. FIG. 22 is a plan view schematically showing one entire semiconductor chip of the semiconductor device and the semiconductor memory device shown in the first to seventh embodiments.

The semiconductor chip according to the structure shown in FIG. 18 will be described as an example of a structure of the semiconductor chip. Therefore, the components of FIG. 22 corresponding to those of FIG. 18 have the same reference characters denoted, and the description of the common components will not be repeated.

Referring to FIG. 22, the periphery portion of a semiconductor chip 800 is surrounded by a field shield region 5 of one conductivity type. A cutting region (dicing line) 801 is formed along the outer periphery of the periphery portion of semiconductor chip 800. Cutting region 801 is provided to separate adjacent chips. A field shield gate electrode 51 is not formed above cutting region 801.

According to the above structure, semiconductor chip 800 can be cut up without damaging field shield gate electrode 51 on semiconductor chip 800 since field shield gate electrode 51 is not provided on cutting region 801.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory formed on an SOI substrate, comprising:

a plurality of N-channel transistor regions each having an N-channel MOS transistor formed therein;

a plurality of P-channel transistor regions each having a P-channel MOS transistor formed therein;

a first field shield region for isolating said N-channel transistor regions from one another;

a second field shield region for isolating said P-channel transistor regions from one another; and an oxide isolation region formed between said N-channel transistor regions on one hand, and said P-channel transistor regions on the other hand, the two types of the transistor regions being disposed adjacent to each other, said oxide isolation region isolating said two types of the transistor regions from each other.

2. A semiconductor memory device formed on an SOI substrate, comprising:

a plurality of N-channel transistor regions each having an N-channel MOS transistor formed therein;

a plurality of P-channel transistor regions each having a P-channel MOS transistor formed therein;

a first field shield region for isolating said N-channel transistor regions from one another;

a second field shield region for isolating said P-channel transistor regions from one another; and an oxide isolation region formed to be adjacent to said first field shield region or said second field shield region.

3. A semiconductor memory according to claim 1, wherein said first and said second field shield region include a field shield gate electrode each, wherein said oxide isolation region includes an oxide isolation film constituting a part thereof, and wherein the field shield gate electrodes of said first and said second field shield region extend partially over said oxide isolation film.

4. A semiconductor memory according to claim 1, wherein said first and said second field shield region include a field shield gate electrode each, wherein said oxide isolation region includes an oxide isolation film constituting a part thereof, and wherein said oxide isolation film extends partially under the field shield gate electrodes.

* * * * *

UNITED STATES PATENT AND TRADEMARK OFFICE
CERTIFICATE OF CORRECTION

PATENT NO. : 5,773,865
DATED : June 30, 1998
INVENTOR(S) : Hideto HIDAKA et al

It is certified that error appears in the above-indentified patent and that said Letters Patent is hereby corrected as shown below:

On the title page, item [75] should read as follows:

--[75]   Inventors:   Hideto Hidaka, Takahiro Tsuruda, Katsuhiro Suma, all of Hyogo, Japan--

Signed and Sealed this

Twenty-ninth Day of September, 1998

Attest:

BRUCE LEHMAN

Attesting Officer                Commissioner of Patents and Trademarks

UNITED STATES PATENT AND TRADEMARK OFFICE
CERTIFICATE OF CORRECTION

PATENT NO. : 5,773,865
DATED : Jun. 30, 1998
INVENTOR(S) : Hidaka et al.

It is certified that error appears in the above-identified patent and that said Letters Patent is hereby corrected as shown below:

col. 24, line 28, delete " A " and insert -- The --.

col. 24, line 29, delete " region include " and insert -- regions each includes --.

col. 24, line 30, delete " each ".

col. 24, line 33, delete " region " and insert -- regions --.

col. 24, line 35, delete " A " and insert -- The --.

col. 24, line 36, delete " region include " and insert -- regions each includes --.

col. 24, line 37, delete " each ".

Signed and Sealed this

Twenty-third Day of February, 1999

Attest:

Q. TODD DICKINSON

*Attesting Officer*   *Acting Commissioner of Patents and Trademarks*